United States Patent
Nekkanty et al.

(10) Patent No.: US 12,009,612 B2
(45) Date of Patent: Jun. 11, 2024

(54) DUAL-SIDED SOCKET DEVICE WITH CORRUGATION STRUCTURES AND SHIELD STRUCTURES

(71) Applicant: Intel Corporation, Santa Clara, CA (US)

(72) Inventors: Srikant Nekkanty, Chandler, AZ (US); Steven Klein, Chandler, AZ (US); Feroz Mohammad, Chandler, AZ (US); Joe Walczyk, Tigard, OR (US); Kuang Liu, Queen Creek, AZ (US); Zhichao Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 654 days.

(21) Appl. No.: 17/032,587

(22) Filed: Sep. 25, 2020

(65) Prior Publication Data

US 2022/0102892 A1    Mar. 31, 2022

(51) Int. Cl.
H01R 13/11 (2006.01)
H05K 1/02 (2006.01)
H05K 9/00 (2006.01)

(52) U.S. Cl.
CPC ........... H01R 13/11 (2013.01); H05K 1/0213 (2013.01); H05K 9/0022 (2013.01)

(58) Field of Classification Search
CPC ... H01R 13/11; H01R 13/2421; H05K 1/0213
See application file for complete search history.

(56) References Cited

U.S. PATENT DOCUMENTS

| | | | |
|---|---|---|---|
| 5,174,763 A * | 12/1992 | Wilson | H01R 13/2421 439/840 |
| 5,613,033 A | 3/1997 | Swamy et al. | |
| 5,931,701 A | 8/1999 | Pan et al. | |
| 6,027,345 A * | 2/2000 | McHugh | H01R 13/6585 439/74 |
| 6,231,352 B1 * | 5/2001 | Gonzales | H01R 12/52 439/66 |
| 6,471,525 B1 * | 10/2002 | Fan | H01R 12/52 439/70 |
| 6,976,851 B2 | 12/2005 | Huang | |

(Continued)

*Primary Examiner* — Neil Abrams
(74) *Attorney, Agent, or Firm* — Essential Patents Group, LLP

(57) ABSTRACT

Techniques and mechanisms for coupling packaged devices with a socket device. In an embodiment, the socket device comprises a socket body structure and conductors extending therethrough. A pitch of the conductors is in a range of between 0.1 millimeters (mm) and 3 mm. First and second metallization structures also extend, respectively, from opposite respective sides of the socket body structure. In the socket body structure, a conductive shield structure, electrically coupled to the first and second metallization structures, substantially extends around one of the conductors. For each of the first and second metallization structures, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

20 Claims, 13 Drawing Sheets

(56) References Cited

U.S. PATENT DOCUMENTS

| | | | | |
|---|---|---|---|---|
| 7,131,850 B2* | 11/2006 | Frutschy | ............... | H05K 7/1061 |
| | | | | 439/71 |
| 7,766,663 B2* | 8/2010 | Yazawa | ................ | H01R 12/716 |
| | | | | 439/74 |
| 8,333,595 B2* | 12/2012 | Uesaka | ................... | H01R 24/50 |
| | | | | 439/63 |
| 8,641,449 B2* | 2/2014 | Cai | ..................... | H01R 13/6585 |
| | | | | 439/607.1 |
| 8,911,266 B2* | 12/2014 | Kawate | .............. | H01R 13/6596 |
| | | | | 439/700 |
| 8,956,193 B2* | 2/2015 | Tran | ......................... | G01R 3/00 |
| | | | | 439/700 |
| 9,059,545 B2* | 6/2015 | Mason | ................ | H01R 13/2421 |
| 9,172,161 B2* | 10/2015 | Walden | .............. | H01R 13/2435 |
| 10,446,955 B2* | 10/2019 | Hoyack | .............. | H01R 13/6582 |
| 10,454,218 B2* | 10/2019 | Hsu | ....................... | H01R 13/428 |
| 10,483,669 B2* | 11/2019 | Petit | ........................ | H01R 43/24 |
| 10,483,695 B2* | 11/2019 | Cheng | ....................... | H01R 4/02 |
| 10,505,303 B2* | 12/2019 | Hoyack | ................... | H01R 12/73 |
| 10,971,846 B2* | 4/2021 | So | .......................... | H01R 12/716 |
| 10,998,660 B2* | 5/2021 | Chen | ....................... | H01R 13/11 |
| 11,749,921 B2* | 9/2023 | Chen | ....................... | H01R 12/73 |
| | | | | 439/66 |
| 2002/0142662 A1 | 10/2002 | Shiroyama et al. | | |
| 2003/0203679 A1 | 10/2003 | Bu et al. | | |
| 2009/0061656 A1 | 3/2009 | Tanaka et al. | | |
| 2013/0045637 A1 | 2/2013 | Yen et al. | | |
| 2014/0270170 A1 | 9/2014 | Lapalme et al. | | |
| 2022/0102883 A1* | 3/2022 | Nekkanty | ............. | H01R 12/714 |
| 2022/0102892 A1* | 3/2022 | Nekkanty | ............. | H01R 13/193 |
| 2023/0197594 A1* | 6/2023 | Meyyappan | ....... | H01L 23/49811 |
| | | | | 257/737 |

* cited by examiner

600

610

Coupling first conductive contacts of a first packaged device to a first interface of a socket device, the first interface comprising a first metallization structure extending from a first side of a socket body structure, and respective first portions of conductors, wherein a pitch of the conductors is in a range of between 0.1 mm and 3 mm

612

Coupling second conductive contacts of a second packaged device each to a second interface of the socket device, the second interface comprising respective second portions of the conductors, and a second metallization structure extending from a second side of the socket body structure, wherein, the first metallization structure and the second metallization structure each form a respective corrugation structure

614

Providing a reference potential to one of the first metallization structure or the second metallization structure, wherein a conductive shield structure, electrically coupled to each of the first metallization structure and the second metallization structure, substantially extends around one of the conductors

616

While the reference potential is provided to the one of the first metallization structure or the second metallization structure, communicating a signal, via the one of the conductors, between the first packaged device and the second packaged device

FIG. 6

DUAL-SIDED SOCKET DEVICE WITH CORRUGATION STRUCTURES AND SHIELD STRUCTURES

BACKGROUND

1. Technical Field

This disclosure generally relates to connector devices and more particularly, but not exclusively, to metallization structures of a dual-sided socket.

2. Background Art

Typically, electrical connectors having various configurations are employed for attaching an integrated-circuit (IC) package to another device such as a printed-circuit board (PCB), or another IC package. Such connectors provide additional versatility to computer platforms by allowing major components, such as microprocessors, to be easily removed and replaced with upgraded units.

Various land grid array (LGA) connectors readily provide a fully separable connection between devices. However, LGA connectors often require additional loading mechanisms to provide a sustained minimum normal force per interconnect for maintaining stable electrical connection. Such loading mechanisms are often complex, increase overall cost, pose challenges for customer implementation, and/or limit bandwidth scaling.

Other connector devices, such as various low insertion force (LIF) connectors, do not require a sustained normal force per pin, and can forego the use of additional loading mechanisms. However, LIF connectors typically provide "plug" and "receptacle" halves which are variously surface mounted each on a respective one of devise that are to be connected. Such surface mounting does not allow for easy and complete separation from an IC package.

As the number, variety and capabilities of packaging solutions continue to proliferate, there is expected to be an increasing premium placed on improvements to connector devices which support such solutions.

BRIEF DESCRIPTION OF THE DRAWINGS

The various embodiments of the present invention are illustrated by way of example, and not by way of limitation, in the figures of the accompanying drawings and in which:

FIG. 6 illustrates a flow diagram showing features of a method to couple a packaged device to a dual-sided socket according to an embodiment.

DETAILED DESCRIPTION

Figure 1A:
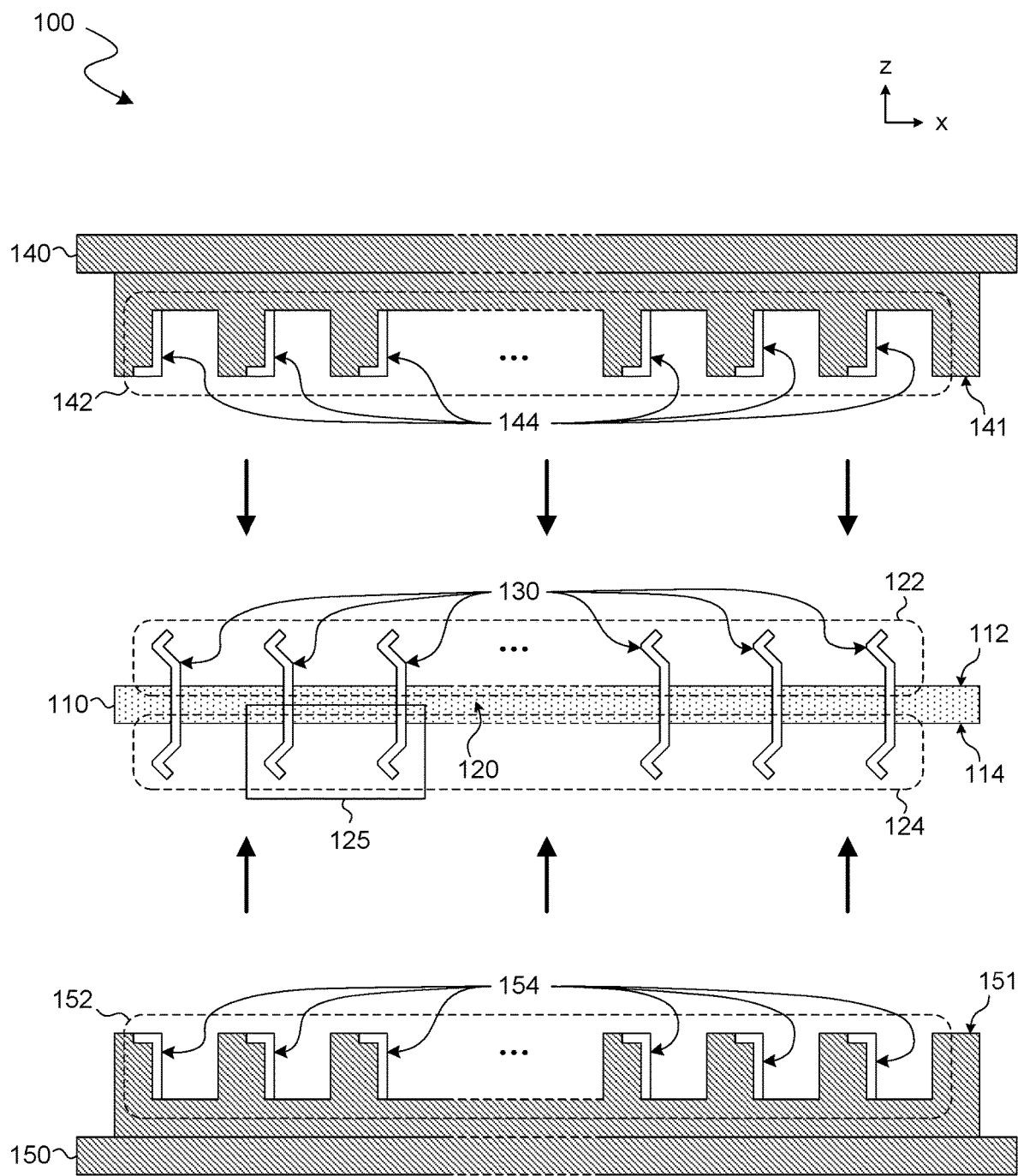
FIGS. 1A, 1B illustrate cross-sectional side view diagrams each showing respective features of a system comprising a socket device according to an embodiment.

Embodiments discussed herein variously provide techniques and mechanisms for coupling an integrated circuit (IC) package with a dual-sided socket device. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including a packaged devices and a socket device coupled thereto.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Figure 1B:
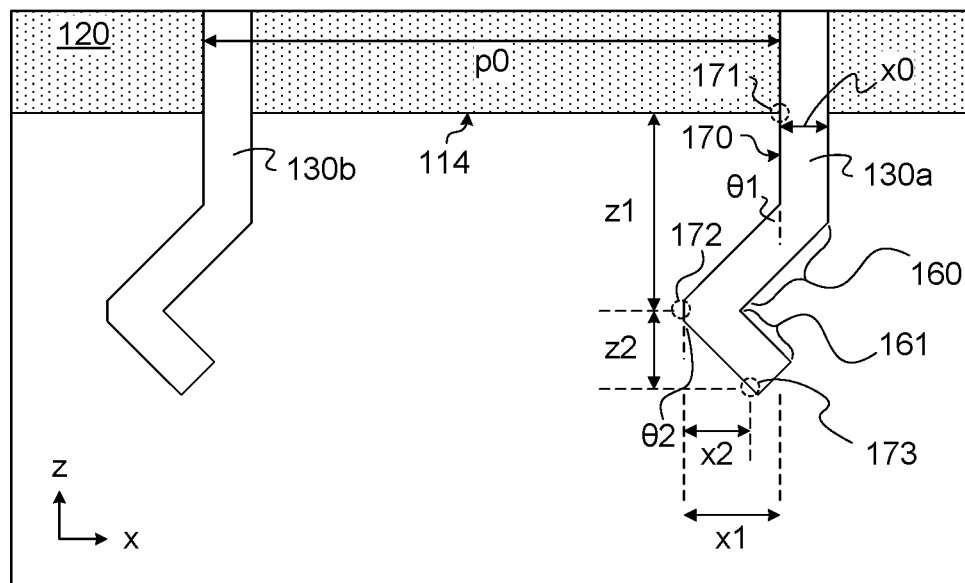

FIGS. 1A, 1B shows features of a system 100 to provide coupling via a socket device according to an embodiment. System 100 illustrates one example of an embodiment wherein a dual-sided socket comprises a first hardware interface which supports coupling to a second hardware interface of a packaged device. The first hardware interface comprises metallization structures (also referred to herein as "pins"), some or all of which each form a respective corrugation structure to facilitate electrical connection to the second hardware interface. Another hardware interface, at an opposite side of the socket device, facilitates coupling with another packaged device—e.g., with similar corrugation structures.

As shown in FIG. 1A, system 100 comprises a dual-sided socket 110 including a socket body structure 120 and hardware interfaces 122, 124 which are at opposite respective sides 112, 114 of socket body structure 120. Conductors 130 of dual-sided socket 110 variously extend through socket body structure 120—e.g., wherein hardware interface 122 comprises respective first portions of conductors 130, and hardware interface 124 comprises respective second portions of conductors 130. In various embodiments, system 100 omits one or both of packaged devices 140, 150—e.g., wherein some or all such embodiments are implemented entirely with dual-sided socket 110.

Conductors 130 each include a respective one or more of copper, gold, nickel, beryllium, or any of various other suitable metals (including any of various alloys or other combination thereof). Socket body structure 120 represents any of various suitable structures to provide mechanical support which accommodates attachment with integrated circuit packages, to facilitate electrical coupling between said integrated circuit packages via conductors 130. For example, socket body structure 120 comprises any of various polymer (for example, plastic) materials—e.g., including Semitron® MP370 from Quadrant Plastics of Zurich, Switzerland—that are adapted from conventional socket connection techniques. In some embodiments, socket body structure 120 is formed by an injection-mold (or other processing) of said polymer material.

Hardware interface 122 accommodates coupling of a first packaged device (such as the illustrative packaged device 140 shown) via surface 112 at a first side of dual-sided socket 110. Furthermore, hardware interface 124 accommodates coupling of a second packaged (such as the illustrative packaged device 150 shown) via surface 114 at a second side of dual-sided socket 110 opposite the first side. In an illustrative scenario according to one embodiment, one of packaged devices 140, 150 comprises a switch package—e.g., wherein the other of packaged devices 140, 150 comprises a photonic engine module which is to communicate with said switch package. However, various embodiments are not limited to a particular functionality that a given one of packaged devices 140, 150 is to provide.

In one such embodiment, a hardware interface 142 of packaged device 140 comprises conductive contacts 144 which are arranged to come into physical contact each with a respective metallization structure of hardware interface 122. Packaged device 140 further comprises conductive traces, vias and/or other suitable interconnect structures (not shown) that are variously electrically coupled each to a respective one of conductive contacts 144. Such interconnect structures facilitate a communication, between conductive contacts 144 and integrated circuitry and/or other circuit resources (not shown) of packaged device 140, of one or more data signals, control signals, clock signals, voltages, and/or the like.

Alternatively or in addition, a hardware interface 152 of packaged device 150 comprises conductive contacts 154 which are arranged to come into physical contact each with a respective metallization structure of hardware interface 124. Packaged device 150 further comprises conductive traces, vias and/or other suitable interconnect structures (not shown) that are variously electrically coupled each to a respective one of conductive contacts 154. Such interconnect structures facilitate a communication, between conductive contacts 154 and integrated circuitry and/or other circuit resources (not shown) of packaged device 150, of one or more data signals, control signals, clock signals, voltages, and/or the like.

In the example embodiment shown, conductive contacts 144 each extend at least in part in a respective recess structure formed with a surface 141 of packaged device 140—e.g., wherein conductive contacts 154 each extend at least in part in a respective recess structure formed with a surface 151 of packaged device 150. However, some embodiments are not limited with respect to the presence of absence of a particular arrangement of such recess structures. For example, in various embodiments, one or more recess structures are additionally or alternatively formed by socket body structure 120 each at a respective one of surfaces 112, 114. In various embodiments, system 100 further comprises, couples to, or other accommodates use of, any of a variety of one or more alignment pins and/or other such structures (not shown) to variously align some or all of conductors 130 each with a respective one of conductive contacts 144 and/or each with a respective one of conductive contacts 154.

Some embodiments variously provide one or more corrugation structures—e.g., each with a respective one of conductors 130—to facilitate coupling of dual-sided socket 110 with packaged device 140 and/or with packaged device 150. As used herein in the context of a socket device, "corrugation structure" refers to a side, surface, or other portion of a metallization structure, where that portion is angled, curved or otherwise shaped to deviate away from, and at least partially return to, a line extending between two points of the metallization structure which are on opposite respective sides of the corrugation structure. A given one of said corrugation structures facilitates "vertical wipe" electrical coupling with a conductive contact of another hardware interface, wherein a surface of the corrugation structure is brought into contact with a substantially vertical (that is, more vertical than horizontal) surface of the conductive contact. In providing such corrugation structures, some embodiments variously enable a dual low insertion force socket which provides one or more easily separable interfaces each to couple (for example) to a respective IC package device. Alternatively or in addition, said embodiments eliminate or otherwise reduce a need for an additional loading mechanism, thus reducing cost and complexity—e.g., as compared to existing LGA-based solutions.

For example, FIG. 1B shows a detail view of a region 125 which includes structures of dual-sided socket 110. As shown in FIG. 1B, dual-sided socket 110 comprises metallization structures 130a, 130b which variously extend in a vertical (z-axis) direction from surface 114 of socket body structure 120. Metallization structures 130a, 130b are provided, for example, each by a different respective one of conductors 130. In the example embodiment shown, a pitch p0 between metallization structures 130a, 130b is in a range of between 0.1 millimeters (mm) and 2 mm—e.g., wherein pitch p0 is an average pitch between respective adjoining ones of conductors 130. For example, pitch p0 is in a range between 0.3 mm and 1 mm (and, in some embodiments, between 0.4 mm and 0.6 mm). In one such embodiment, a thickness x0 of metallization structure 130a at surface 114 is in a range of between 0.01 mm and 0.2 mm—e.g., wherein the range is between 0.03 mm and 0.1 mm (and, in some embodiments, between 0.04 mm and 0.06 mm).

An overall vertical span of a given metallization structure (e.g., metallization structure 130a) is in a range of between 0.05 mm and 2.0 mm. For example, said vertical span is in a range of between 0.15 mm and 1.0 mm (and, in some embodiments, between 0.4 mm and 0.7 mm). In the context of metallization structure 130a, "overall vertical span" refers herein to a vertical (z-axis) distance from side 114 which is spanned by metallization structure 130a. For example, such a vertical distance extends between a point 171 where a side 170 of metallization structure 130a is at 114, and another point on side 170 (in this example, point 173) which is at a distal end of metallization structure 130a.

To facilitate coupling of dual-sided socket 110 to a packaged device, metallization structure 130a forms a corrugation structure—e.g., at least with that part of side 170 which is formed by portions 160, 161 of metallization structure 130a—which deviates horizontally (along the x-axis shown) from a line extending between two points on side 170. In various embodiments, that portion of side 170 which forms the corrugation structure (at least in part) comprises one or more points which, of all points of the corrugation structure, are most offset in a particular horizontal direction from another point of side 170 which is at an end of—or, for example, outside of—the corrugation structure.

In the example embodiment shown, the corrugation structure comprises a point 172 which is most offset horizontally from a line extending between points 171, 173. FIG. 1B shows a horizontal distance x1 between the respective x-axis positions of point 172 and another point at side 170 (in this example, point 171) which is closer to surface 114, and which is outside of, or at an end of, the corrugation structure. FIG. 1B also shows a horizontal distance x2 between the respective x-axis positions of point 172 and another point at side 170 (in this example, point 173) which is farther from surface 114, and which is outside of, or at an end of, the corrugation structure. A horizontal distance (along the x-axis shown) which is spanned by a given structure is referred to herein as the "horizontal span" of that structure. In the example embodiment shown, the horizontal span of the corrugation structure formed by side 170 is equal to a greater of the two horizontal distances x1 and x2 shown.

In various embodiments, the horizontal span of side 170 at the corrugation structure is at least 5% of the vertical span of metallization structure 130a—e.g., wherein the horizontal span is at least 10% of the overall vertical span of metallization structure 130a. In various embodiments, the horizontal span of side 170 at the corrugation structure is in a range of between 5% and 40% of the overall vertical span of metallization structure 130a—e.g., wherein the range is between 10% and 30% of said vertical span.

In various embodiments, a vertical distance z1 between point 172 and a vertically closest point of surface 114 is in a range of between 5% and 95% of the overall vertical span of metallization structure 130a. In one such embodiment, the vertical distance z1 is in a range of between 25% and 75% of said overall vertical span. Alternatively or in addition, a vertical distance z2 between points 172, 173 is in a range of between 5% and 95% of the overall vertical span of metallization structure 130a—e.g., wherein the range is between 25% and 75% of said vertical span. In one such embodiment, the overall vertical span of metallization structure 130a is greater than or equal to a sum of the vertical distances z1, z2 shown.

Alternatively or in addition, that section of side 170 which is at portion 161 forms an angle θ2 with a vertical plane which extends down from surface 114. In one such embodiment, the angle θ2 is in a range of between 20° (degrees) and 80°—e.g., wherein the range is between 30° and 70° (and, in some embodiment, between 30° and 65°). Additionally or alternatively, that section of side 170 which is at portion 160 forms an angle θ1 with a vertical plane which extends down from surface 114. In one such embodiment, the angle θ1 is in a range of between 20° (degrees) and 80°—e.g., wherein the range is between 30° and 80° (and, in some embodiments, between 35° and 80°).

In some embodiments, dual-sided socket device 110 further comprises one or more conductive structures (not shown)—referred to herein as "shield structures"—which variously extend in socket body structure 120 each to protect a quality of a respective signal communicated between hardware interfaces 122, 124. In one such embodiment, a shield structure is electrically coupled to one or more of conductors 130 which (for example) are each to provide a ground voltage, or other reference potential. Within socket body structure 120, the shield structure extends substantially around another electrode of dual-sided socket device 110—e.g., where said other electrode is to communicate a data, control, clock or other signal between hardware interfaces 122, 124.

Figure 2:
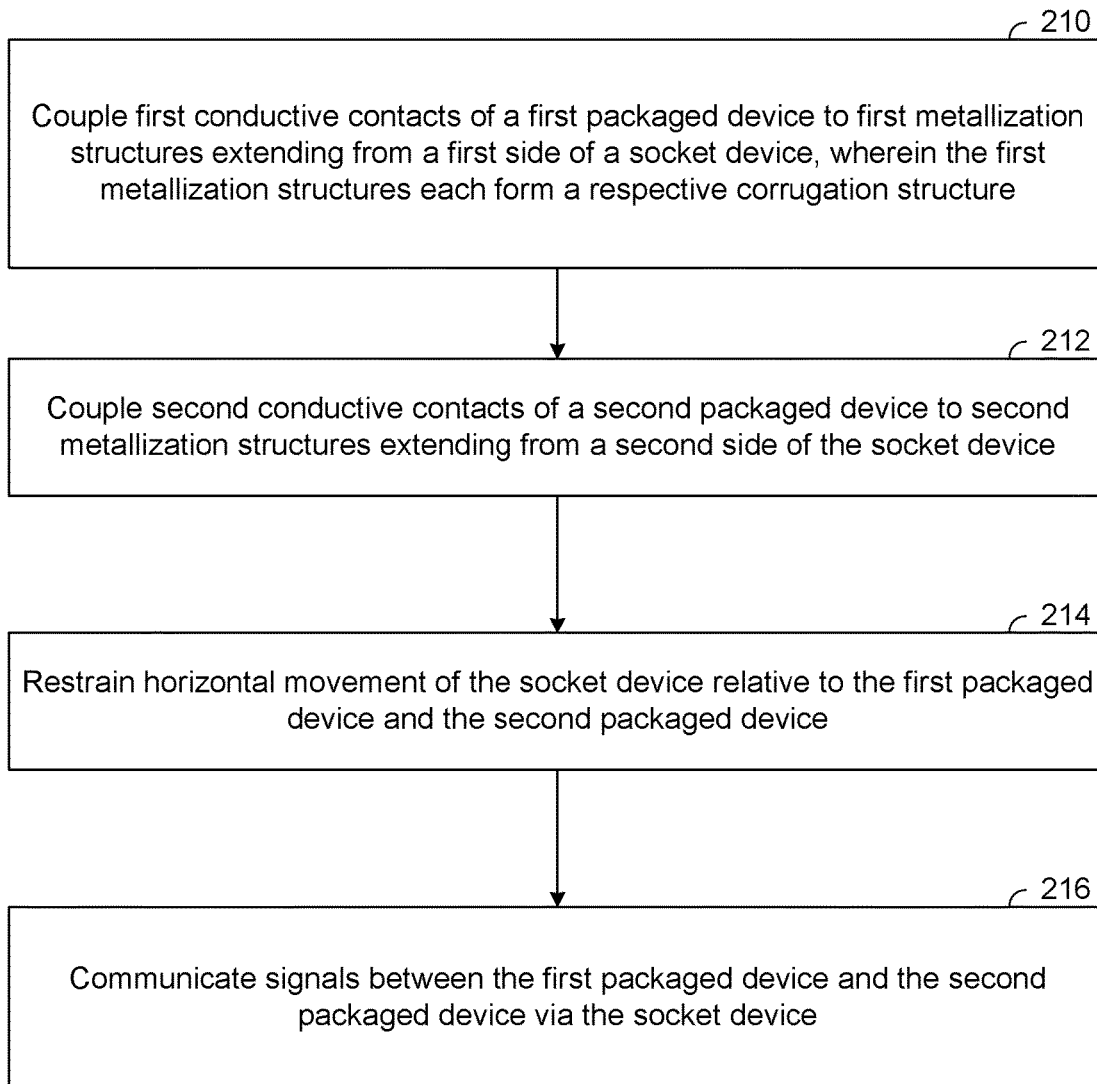
FIG. 2 illustrates a flow diagram showing features of a method to couple a packaged device to a dual-sided socket according to an embodiment.

FIG. 2 shows features of a method 200 to facilitate coupling of packages via a dual-sided socket device according to an embodiment. Method 200 is one example of an embodiment that provides functionality such as that of system 100.

Method 200 comprises (at 210) coupling first conductive contacts of a first packaged device each to a respective one of a first plurality of metallization structures of a socket device. For example, the coupling at 210 comprises coupling conductive contacts 144 of hardware interface 142 each to a respective metallization structure of hardware interface 122. The first plurality of metallization structures each extend vertically from a first side of a socket body structure of the socket device. In an embodiment, a pitch of the first plurality of metallization structures is in a range of between 0.1 millimeters (mm) and 2 mm.

The first plurality of metallization structures—e.g., including respective first portions of conductors 130—each form a respective corrugation structure to promote a mechanical strength of coupling with the first packaged device. Each such corrugation structure has features such as those of the corrugation structure formed by metallization structure 130a, for example. In one such embodiment, for each of the first plurality of metallization structures, a vertical span of the metallization structure is in a range of between 0.05 mm and 2.0 mm, wherein a portion of a side of the metallization structure forms a respective corrugation structure, and wherein a horizontal span of that portion of the side is at least 5% (and in some embodiments, at least 10%) of the vertical span of the metallization structure.

By way of illustration and not limitation, for each of the first plurality of metallization structures, the side of the metallization structure which forms the corrugation structure includes a first point, a second point, and a third point, wherein the second point (which is between the first point and the third point) is a point of the respective corrugation structure which is most offset horizontally from a line which extends between the first point and the third point. In one such embodiment, a vertical distance between the second point and a distal end of the metallization structure is at least 5% of the vertical span of that metallization structure. In various embodiments, for each of the first plurality of metallization structures, that portion of the side of the metallization structure which forms the respective corrugation structure does so at least in part by forming an angle with a vertical plane, wherein the angle is in a range of between 20° and 80°.

Method 200 further comprises (at 212) coupling second conductive contacts of a second packaged device each to a respective one of a second plurality of metallization structures of the socket device. For example, the coupling at 212 comprises coupling conductive contacts 154 of hardware interface 152 each to a respective metallization structure of hardware interface 124. The second plurality of metallization structures—e.g., including respective second portions of conductors 130—each extend vertically from a second side of the socket body structure. The second plurality of metallization structures are each electrically coupled to a respective one of the first plurality of metallization structures.

In some embodiments, each of the first plurality of metallization structures and the second metallization structures forms a respective corrugation structure having (for example) features such as those of the corrugation structure formed by metallization structure 130a. In some embodiments, the socket body structure forms first recess structures at the first side, wherein the first plurality of metallization structures each extend in a respective one of the first recess structures. Additionally or alternatively, the socket body structure forms second recess structures at the second side, wherein the second plurality of metallization structures each extend in a respective one of the second recess structures.

Method 200 further comprises (at 214) mechanically restraining horizontal movement of the socket device relative to the first packaged device and the second packaged device. Subsequently (at 216), method 200 communicates signals, each via a respective one of the first plurality of metallization structures and a respective one of the second plurality of metallization structures, between the first packaged device and the second packaged device.

In an example embodiment, the restraining at 214 comprises placing any of a variety of restraining devices—e.g., including one or more alignment pins, brackets or the like—on, around or through one or more of the socket device, the first packaged device, and the second packaged device to maintain an application of a force generated at least in part by a deformation of the first plurality of metallization structures and/or the second plurality of metallization structures. Such deformation is caused, for example, by corrugation structures each coming into contact with a substantially vertical structure of a corresponding conductive contact. In various embodiments, method 200 omits the mechanical restraining at 214—e.g., wherein opposing forces are generated by deformations, in opposite directions, of different respective metallization structures.

Figure 3A:
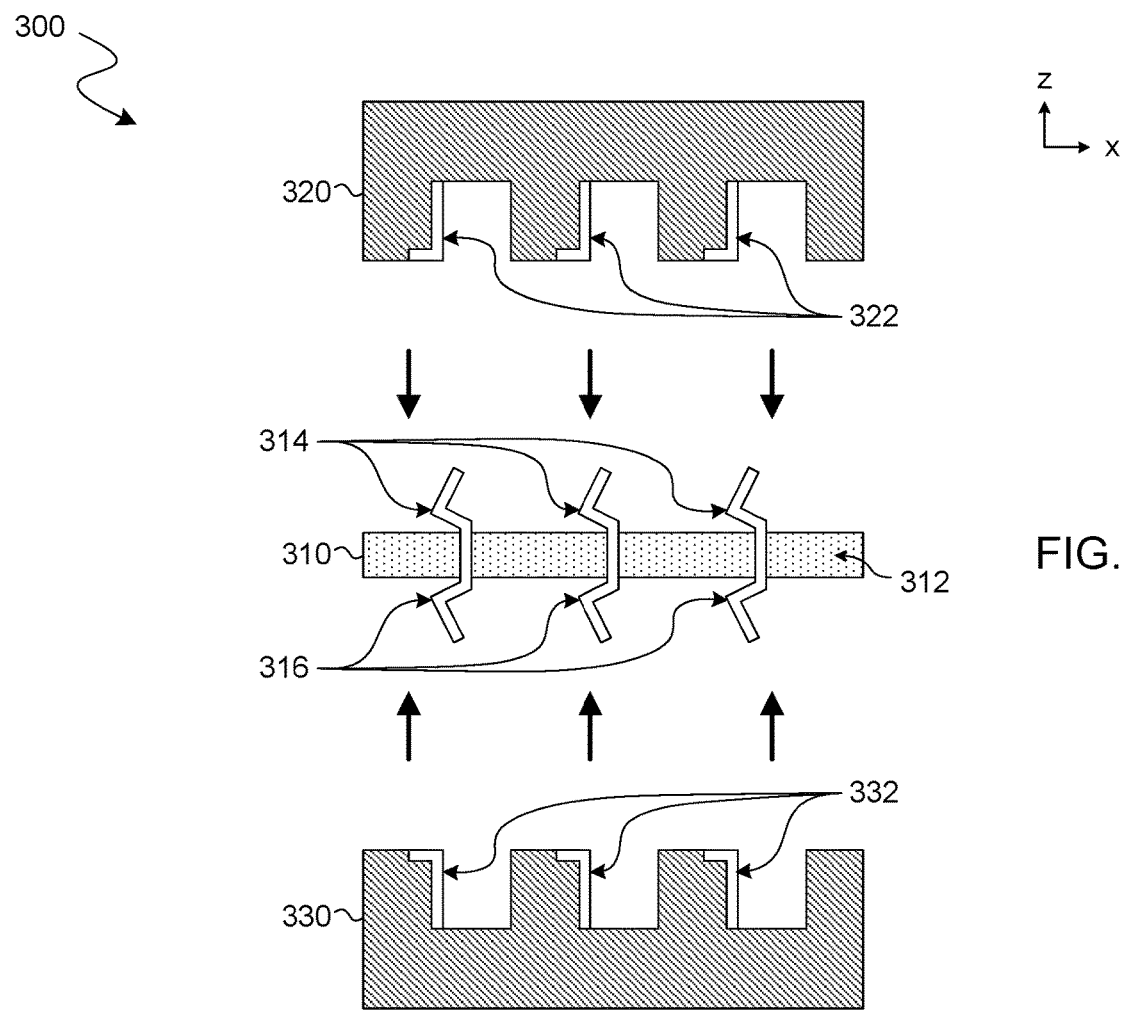
FIGS. 3A, 3B illustrate cross-sectional side view diagrams each showing respective features of an assembly of packages with a socket device according to an embodiment.
Figure 3B:
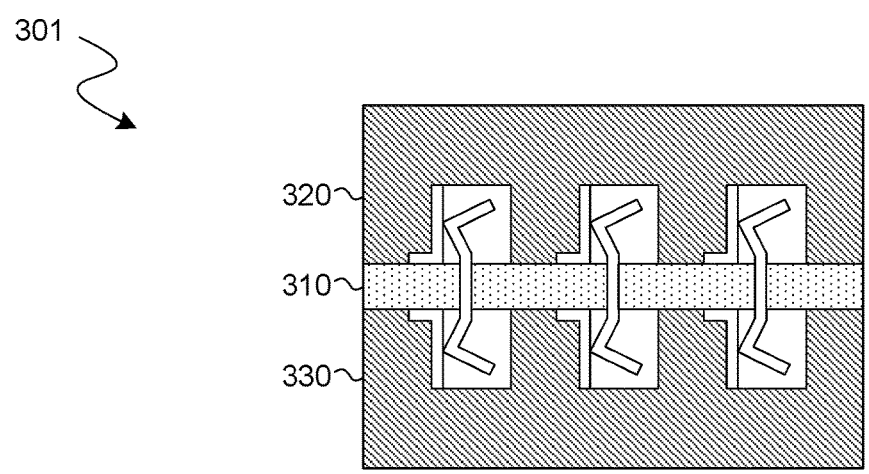

FIGS. 3A, 3B show stages 301, 302 of an assembly process to couple packaged devices each to a dual-sided socket according to an embodiment. Assembly such as that illustrated by stages 301, 302 is to provide structures such as those of system 100—e.g., where such assembly includes some or all of method 200.

As shown in FIG. 3A, packaged devices 320, 330 are variously brought into alignment with a dual-sided socket 310 at stage 300—e.g., where dual-sided socket 310, packaged device 320, and packaged device 330 correspond functionally to dual-sided socket 110, packaged device 140, and packaged device 150 (respectively). Dual-sided socket 310 comprises a socket body structure 312 and conductors which variously extend vertically therefrom. For example, a first hardware interface of dual-sided socket 310 comprises metallization structures 314 which variously extend vertically from a first side of socket body structure 312. Furthermore, a second hardware interface of dual-sided socket 310 comprises metallization structures 316 variously extending vertically from a second side of socket body structure 312 which is opposite the first side. One or more of metallization structures 314 and/or metallization structures 316 each form a respective corrugation structure which, for example, has some or all of the features of the corrugation structure formed by metallization structure 130a. For example, metallization structures 314 and metallization structures 316 are formed (for example) by conductors 130, in one embodiment.

A hardware interface of packaged device 320 comprises conductive contacts 322 which each form, at least in part, a respective sidewall of a corresponding recess structure. Alternatively or in addition, another hardware interface of packaged device 330 comprises conductive contacts 332 which each form, at least in part, a respective sidewall of a corresponding recess structure. In one such embodiment, conductive contacts 322, and conductive contacts 332 correspond functionally to conductive contacts 144, and conductive contacts 154 (respectively). At stage 300, some or all of metallization structures 314 are each aligned with a different respective one of conductive contacts 322—e.g., wherein some or all of metallization structures 316 are each aligned with a different respective one of conductive contacts 332.

At stage 301, dual-sided socket 310 and packaged device 320 are moved relative to each other to bring metallization structures 314 each into a respective recess structure of packaged device 320. For a given one of metallization structures 314, such relative motion of dual-sided socket 310 with respect to packaged device 320 results in a corrugation, formed by that metallization structure, being brought into contact with a substantially vertical surface of a corresponding one of conductive contacts 322. More particularly, the corresponding conductive contact is brought into contact with a point at a lateral side of the metallization structure (e.g., rather than at a distal end of the metallization structure). In various embodiments, this contact results in a horizontal (in an x-y plane) deflection of the metallization structure—e.g., wherein a bracket, alignment pin or other securing mechanism (not shown) resists lateral movement of dual-sided socket 310 relative to packaged device 320, to maintain some or all of said horizontal deflection. This deflection provides an effective mechanism by which the metallization structure maintains an application of force on the corresponding conductive contact. This force, in combination with similar forces variously applied by others of metallization structures 314 each on a respective one of conductive contacts 332, provides for increased friction—and thus an increased coupling strength—between dual-sided socket 310 and packaged device 320.

Similarly, at stage 301, dual-sided socket 310 and packaged device 330 are moved relative to each other to bring metallization structures 316 each into a respective recess structure of packaged device 330. For a given one of metallization structures 316, such relative motion results in a corrugation, formed by that metallization structure, being brought into contact with a substantially vertical surface of a corresponding one of conductive contacts 332. In various embodiments, this contact results in a horizontal (in an x-y plane) deflection of the metallization structure—e.g., wherein a securing mechanism (not shown) such as an alignment pin maintains some or all of said horizontal deflection. As with metallization structures 314, deflection of metallization structures 316 (using corrugation structures thereof), facilitates increased friction—and thus an increased coupling strength—between dual-sided socket 310 and packaged device 330.

Figure 4A:
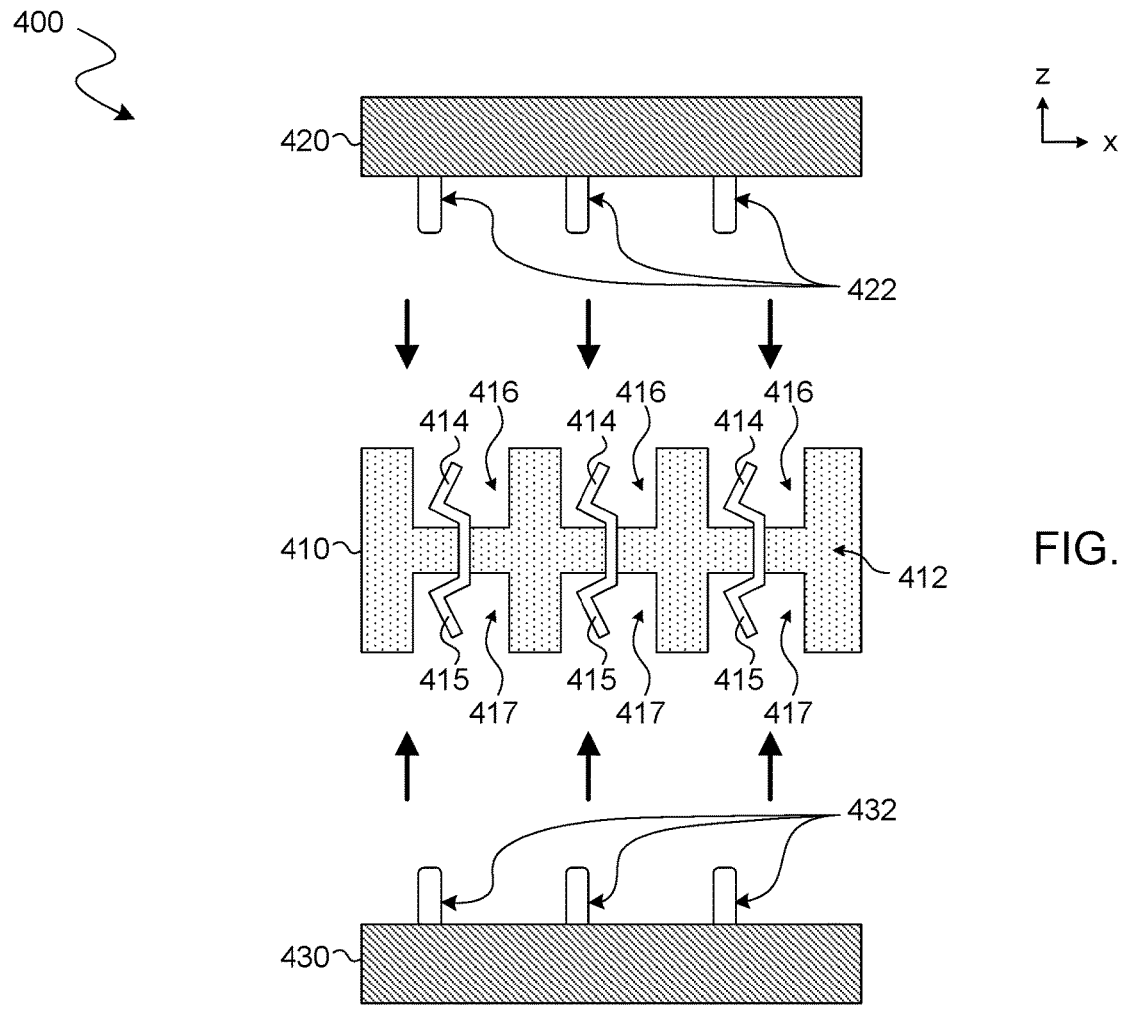
FIGS. 4A, 4B illustrate cross-sectional side view diagrams each showing respective features of an assembly of packages with a socket device according to an embodiment.
Figure 4B:
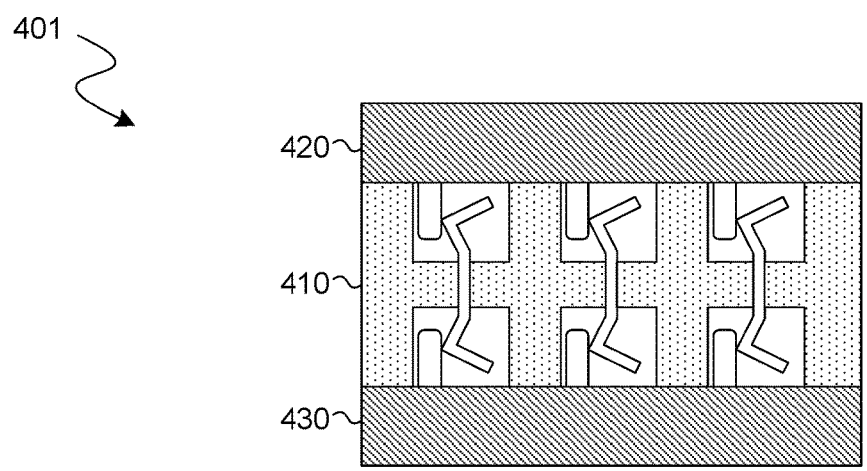

FIGS. 4A, 4B show stages 401, 402 of an assembly process to couple packaged devices each to a dual-sided socket according to an alternative embodiment. Assembly such as that illustrated by stages 401, 402 is to provide structures such as those of system 100, and/or is performed according to method 200 (for example).

As shown in FIG. 4A, packaged devices 420, 430 are variously brought into alignment with a dual-sided socket 410 at stage 400—e.g., where dual-sided socket 410, packaged device 420, and packaged device 430 correspond functionally to dual-sided socket 110, packaged device 140, and packaged device 150 (respectively). Dual-sided socket 410 comprises a socket body structure 412 and conductors which variously extend vertically therefrom.

For example, a first side of socket body structure 412 forms first recess structures 416, wherein a first hardware interface of dual-sided socket 410 comprises metallization structures 414 which variously extend vertically from the first side, each in a respective one of the first recess structures 416. Furthermore, a second side of socket body structure 412 (opposite the first side) forms second recess structures 417, wherein a second hardware interface of dual-sided socket 410 comprises metallization structures 415 which variously extend vertically from the second side, each in a respective one of the second recess structures 417. One or more of metallization structures 414 and/or metallization structures 416 each form a respective corrugation structure which, for example, has some or all of the features of the corrugation structure formed by metallization structure 130a. In one embodiment, metallization structures 414, and metallization structures 415 correspond functionally to metallization structures 314, and metallization structures 316 (respectively).

A hardware interface of packaged device 420 comprises conductive contacts 422 which, in the illustrative embodiment shown, are formed by copper (or copper plated) pillars. Alternatively or in addition, another hardware interface of packaged device 430 comprises conductive contacts 432 which (for example) are similarly formed by copper (or copper plated) pillars. In one such embodiment, conductive contacts 422, and conductive contacts 432 correspond functionally to conductive contacts 144, and conductive contacts 154 (respectively). At stage 400, some or all of metallization structures 414 are each aligned with a different respective one of conductive contacts 422—e.g., wherein some or all of metallization structures 416 are each aligned with a different respective one of conductive contacts 432.

At stage 401, dual-sided socket 410 and packaged device 420 are moved relative to each other to bring conductive contacts 422 each into a respective one of recess structures 417. For a given one of metallization structures 414, such relative motion of dual-sided socket 410 and packaged device 420 results in a corrugation, formed by that metallization structure, being brought into contact with a substantially vertical surface of a corresponding one of conductive contacts 422. More particularly, the corresponding conductive contact is brought into contact with a point at a lateral side of the metallization structure. This contact results in a horizontal deflection of the metallization structure, which (for example) is maintained by a bracket, alignment pin or other securing mechanism (not shown). Such deflection, in combination with similar deflections of others of metallization structures 414, provides for increased friction—and thus an increased coupling strength—between dual-sided socket 410 and packaged device 420.

Similarly, at stage 401, dual-sided socket 410 and packaged device 430 are moved relative to each other to bring conductive contacts 432 each into a respective one of recess structures 417. For a given one of metallization structures 416, such relative motion results in a corrugation, formed by that metallization structure, being brought into contact with a substantially vertical surface of a corresponding one of conductive contacts 432. In various embodiments, this contact results in a horizontal (in an x-y plane) deflection of the metallization structure—e.g., wherein a securing mechanism (not shown) such as an alignment pin maintains some or all of said horizontal deflection. As with metallization structures 414, deflection of metallization structures 416 (using corrugation structures thereof), facilitates increased coupling strength between dual-sided socket 410 and packaged device 430.

Figure 5:
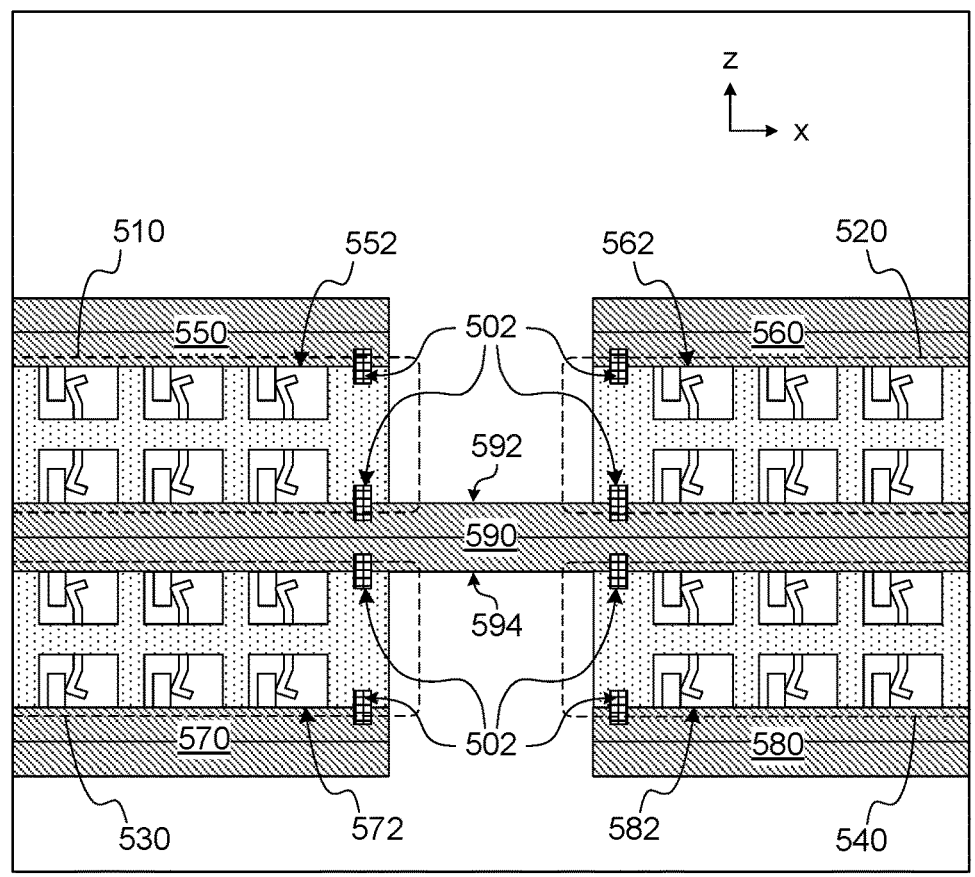
FIG. 5 illustrates a cross-sectional side view diagram showing features of a system comprising multiple dual-sided sockets according to an embodiment.

FIG. 5 shows features of a system 500 to facilitate coupling between packaged devices with multiple dual-sided sockets according to an embodiment. System 500 illustrates one example embodiment wherein a packaged device is coupled to another package device via two or more socket devices (and, for example, also via a third packaged device). Some or all of the socket devices comprise metallization structures which form respective corrugation structures to facilitate coupling between hardware interfaces. In various embodiments, system 500 includes features of system 100—e.g., where functionality of system 500 is provided according to method 200.

As shown in FIG. 5, system 500 comprises socket devices 510, 520, 530, 540, and packaged devices 550, 560, 570, 580, 590 which are variously coupled thereto. More particularly, socket devices 510, 520 are variously coupled to packaged device 580 via a surface 592 thereof—e.g., wherein socket devices 530, 540 are variously coupled to an opposite surface 594 of packaged device 590. Furthermore, socket device 510 is coupled to packaged device 550 via a surface 552 thereof, wherein socket device 520 is further coupled to a surface 562 of packaged device 560. Further still, socket device 530 is coupled to packaged device 570 via a surface 572 thereof, wherein socket device 540 is further coupled to a surface 582 of packaged device 580

In one such embodiment, some or all of socket devices 510, 520, 530, 540 each include respective features of dual-sided socket 110. For example, metallization structures of socket devices 510, 520, 530, 540 form respective corrugation structures which contribute to the deflection of said metallization structures when they are variously brought into contact with conductive contact structures of packaged devices 550, 560, 570, 580, 590. Such deflection contributes to friction, and a corresponding holding strength, between a given socket and a given packaged device which is coupled thereto. Alignment pins (e.g., including the illustrative pins 502 shown) variously prevent a relative lateral movement between a given socket and a given packaged device. As a result, the deflection of the metallization structures is maintained to promote the coupling of packaged devices to socket devices.

FIG. 6 shows features of a method 600 to facilitate coupling of packages via a dual-sided socket device according to another embodiment. Method 600 is an example of an embodiment that provides functionality such as that of system 100.

Method 600 comprises (at 610) coupling first conductive contacts of a first packaged device to a first interface of a socket device. The first interface—e.g., having features of hardware interface 122—comprises a first metallization structure extending vertically from a first side of a socket body structure of the socket device. The first interface further comprises respective first portions of multiple conductors which, for example, each extend through the socket body structure. In various embodiments, a pitch of the conductors at the first side is in a range of between 0.1 millimeters (mm) and 3 mm.

Method 600 further comprises (at 612) coupling second conductive contacts of a second packaged device each to a second interface of the socket device. The second interface—e.g., having features of hardware interface 124—comprises respective second portions of the conductors, where said second portions each extend vertically from a second side of the socket body structure (the second side opposite the first side). The second interface further comprises second metallization structure which each extend vertically from the second side of the socket body structure.

For each of the first metallization structure and the second metallization structure, a vertical span of the metallization structure is in a range between 0.05 mm and 2.0 mm, wherein a portion of a side of that metallization structure forms a respective corrugation structure, and wherein a horizontal span of that portion is at least 5% of the vertical span of the metallization structure. Furthermore, a conductive shield structure of the socket device is electrically coupled to each of the first metallization structure and the second metallization structure. The conductive shield structure, which is between the first side and second side of the socket body structure, substantially extends around one of the conductors to facilitate electromagnetic ground shielding of communications via that conductor.

In various embodiments, the first metallization structure is one of a first plurality of metallization structures of the first interface—e.g., wherein the second metallization structure is one of a second plurality of metallization structures of the second interface. Moreover, multiple conductive shield structures of the socket device are each between the first side and the second side, and are each electrically coupled both to a respective one of the first plurality of metallization structures and to a respective one of the second plurality of metallization structures. For example, the multiple conductive shield structures each substantially extend around a respective one of the conductors. In one such embodiment, the multiple conductive shield structures are electrically coupled to each other. Additionally or alternatively, one or more of the multiple conductive shield structures each substantially extends around a respective two of the conductors—e.g., wherein the two conductors are to communicate a differential signal pair.

In one such embodiment, for each metallization structure of the first plurality of metallization structures and the second plurality of metallization structures, a vertical span of the metallization structure is in a range of between 0.05 mm and 2.0 mm, wherein a portion of a side of the metallization structure forms a respective corrugation structure, and wherein a horizontal span of the portion is at least 5% of the vertical span of the metallization structure.

In one such embodiment, for each of the conductors, a respective two of the first plurality of metallization structures are on opposite respective sides of the respective first portion of the conductor—e.g., wherein a respective two of the second plurality of metallization structures are on opposite respective sides of the respective second portion of the conductor. Furthermore, a respective one of the multiple conductive shield structures is electrically coupled to each of the respective two of the first plurality of metallization structures, and the respective two of the second plurality of metallization structures.

Method 600 further comprises (at 614) providing a reference (e.g., a ground) potential to one of the first metallization structure or the second metallization structure, and—while the reference potential is provided at 614—communicating a signal (at 616), via the one of the conductors, between the first packaged device and the second packaged device.

Figure 7A:
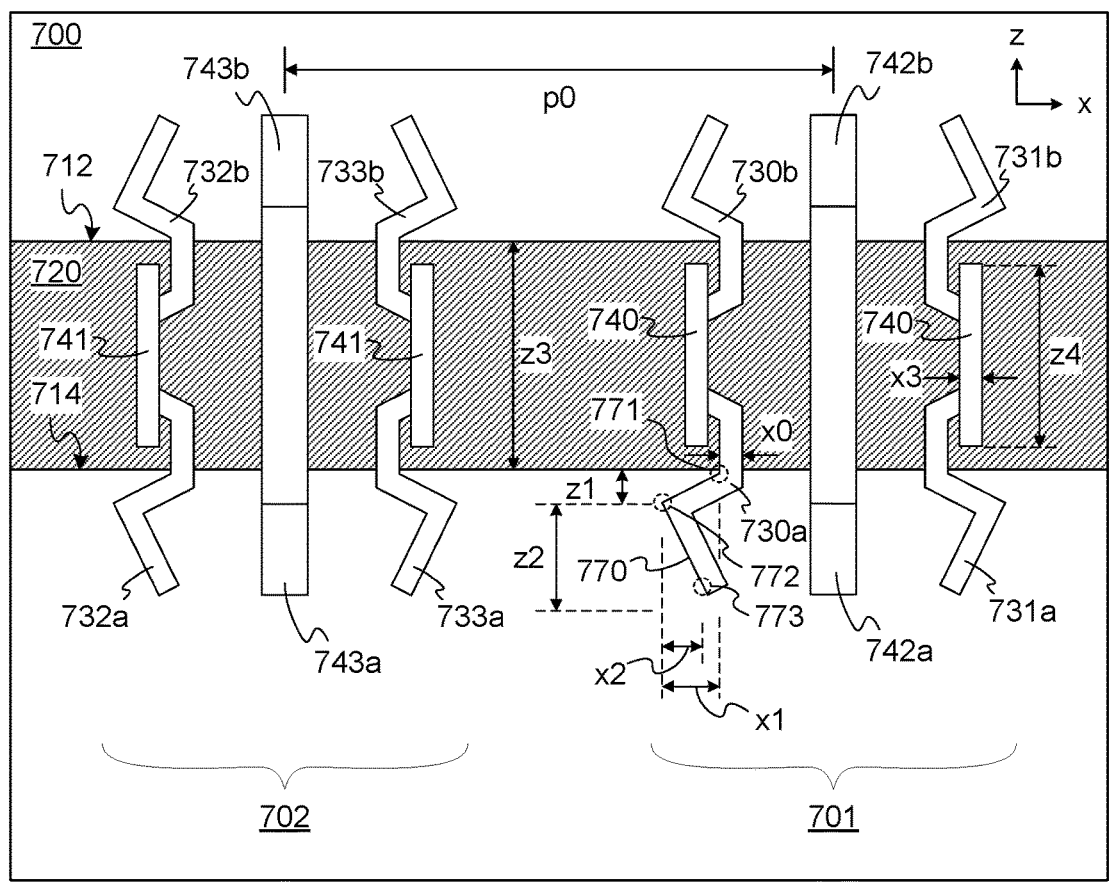
FIGS. 7A, 7B illustrate cross-sectional view diagrams each showing respective features of a dual-sided socket comprising a shield structure according to a corresponding embodiment.
Figure 7B:
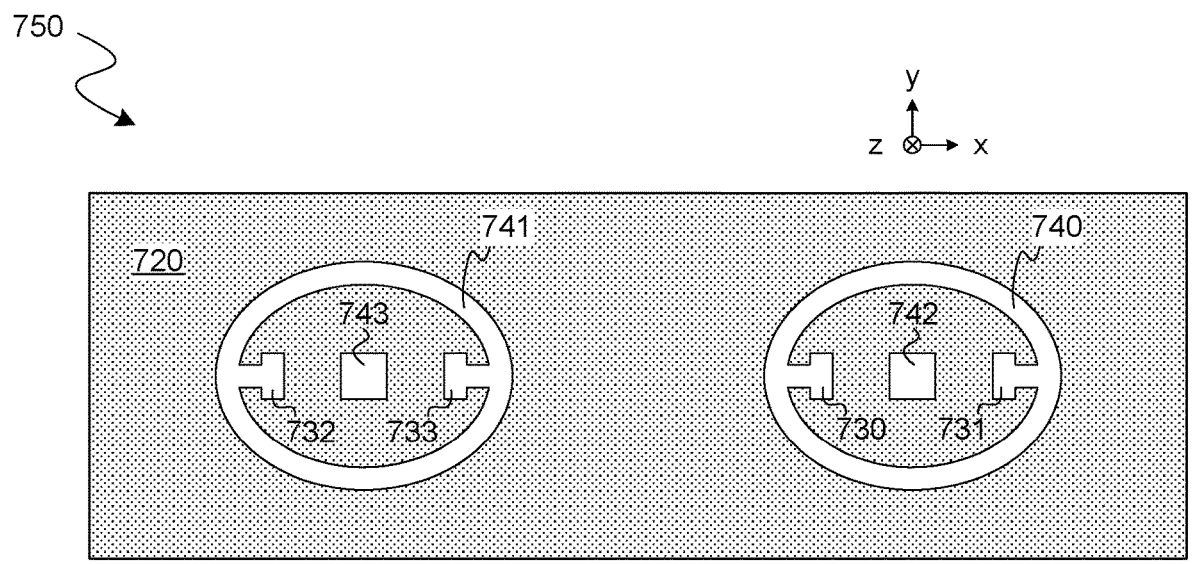

FIGS. 7A, 7B shows features of a dual-sided socket device 700 comprising corrugation structures according to an embodiment. Dual-sided socket device 700 includes some or all of the features of dual-sided socket 110, in some embodiments—e.g., wherein functionality of dual-sided socket 700 is provide according to one of methods 200, 600.

As shown in FIG. 7A, dual-sided socket device 700 comprises a socket body structure 720 and hardware interfaces (e.g., hardware interfaces 122, 124) which are at opposite respective sides of socket body structure 720. A first hardware interface of dual-sided socket 700 comprises metallization structures 730a, 731a, 732a, 733a, 742a, 743a which variously extend vertically from a surface 714 of socket body structure 720. Furthermore, a second hardware interface of dual-sided socket 700 comprises metallization structures 730b, 731b, 732b, 733b, 742b, 743b which variously extend vertically from an opposite surface 712 of socket body structure 720. Metallization structures 730a, 731a, 732a, 733a, 742a, 743a are electrically coupled, through socket body structure 720, to metallization structures 730b, 731b, 732b, 733b, 742b, 743b (respectively).

In one such embodiment, metallization structures 742a, 742b are respective portions of a first conductor which is to communicate a first single-ended signal through socket body structure 720. Protection of an integrity of the first electrical signal is provided at least in part with a shield structure 740 which is electrically coupled to each of metallization structures 730a, 730b, 731a, 731b. For example, metallization structures 730a, 730b, 731a, 731b are to variously provide a ground voltage (or other reference potential), wherein shield structure 740 extends substantially around the first conductor. In this particular context, extending "substantially around" refers to the characteristic of shield structure 740 extending—e.g., in an x-y plane—at least 50% radially around the first conductor.

Alternatively or in addition, metallization structures 743a, 743b are respective portions of a second conductor which is to communicate a second single-ended signal through socket body structure 720. Protection of an integrity of the second electrical signal is provided at least in part with a shield structure 741 which is electrically coupled to each of metallization structures 732a, 732b, 733a, 733b. For example, metallization structures 732a, 732b, 733a, 733b are to variously provide a ground voltage (or other reference potential), wherein shield structure 740 extends substantially around the second conductor.

FIG. 7B shows a cross-sectional top view 750 of dual-sided socket 700. As shown in view 750, shield structure 740 extends substantially around a conductor 742 which comprises metallization structures 742a, 742b, wherein interconnect structures 730, 731 variously extend in socket body structure 720 to provide electrical coupling between shield structure 740 and metallization structures 730a, 731a (respectively). Furthermore, shield structure 741 extends substantially around a conductor 743 which comprises metallization structures 743a, 743b, wherein interconnect structures 732, 733 variously extend in socket body structure 720 to provide electrical coupling between shield structure 741 and metallization structures 732a, 733a (respectively).

In various embodiments, metallization structures 730a, 731a, 732a, 733a are variously provide vertical wipe contacts each with a respective conductive contact of a first packaged device—e.g., wherein metallization structures 730b, 731b, 732b, 733b are variously provide vertical wipe contacts each with a respective conductive contact of a second packaged device. In one such embodiment, metallization structures 742a, 743a each provide horizontal wipe contact with a respective conductive contact of the first packaged device—e.g., wherein metallization structures 742b, 743b each provide horizontal wipe contact with a respective conductive contact of the second packaged device. For example, respective distal ends of metallization structures 742a, 742b, 743a, 743 variously bend, curve, or otherwise deviate (e.g., in a y-axis direction) each to accommodate vertical compression (and, in some embodiments, horizontal deflection) when brought into contact with a corresponding metal pad or other suitable conductive contact.

To facilitate coupling between two packaged devices via dual-sided socket 700, metallization structures 730a-733a, 730b-733b variously form respective corrugation structures—e.g., where a side 770 of metallization structure 730a forms one such corrugation at least in part. To illustrate certain features of various embodiments, example dimensions of a corrugation structure formed with side 770 are provided herein. Some or all such example dimensions are similarly applicable, for example, to respective corrugation structures of one or more of metallization structures 731a-733a, 730b-733b. Various embodiments are not limited at least with respect to one or more such dimensions, which may vary (for example) according to implementation-specific details.

In the example embodiment shown, a pitch p0 between metallization structures 743b, 742b is in a range of between 0.1 mm and 3 mm. For example, pitch p0 is in a range between 0.2 mm and 1.5 mm (and, in some embodiments, between 0.4 mm and 1 mm). In various embodiments, pitch p0 is an average "pin-to-pin" pitch—e.g., an average of distances between functionally corresponding metallization structures. For example, pitch p0 is an average of distances including respective distances between metallization structures 730b, 732b, between metallization structures 731b, 733b, between metallization structures 743a, 742a, between metallization structures 730a, 732a, between metallization structures 731a, 733a, etc.

In one such embodiment, a thickness x0 of metallization structure 730a at surface 714 is in a range of between 0.01 mm and 0.2 mm—e.g., wherein the range is between 0.03 mm and 0.1 mm (and, in some embodiments, between 0.04 mm and 0.06 mm). Alternatively or in addition, an overall vertical span of metallization structure 730a (or an overall vertical span of one of metallization structures 742a, 743a) is in a range of between 0.05 mm and 2.0 mm. For example, said vertical span is in a range of between 0.05 mm and 0.75 mm (and, in some embodiments, between 0.1 mm and 0.5 mm).

A side 770 of metallization structure 730a has points 771-773 variously located thereon, wherein point 772 is between points 771, 773. In the example embodiment shown, a corrugation structure is formed by point 772 being offset horizontally from a line extending between points 771, 773. In various embodiments, a vertical distance z1 between point 772 and a vertically closest point of surface 714 is in a range of between 5% and 95% of the overall vertical span of metallization structure 730a. In one such embodiment, the vertical distance z1 is in a range of between 25% and 75% of said overall vertical span. Alternatively or in addition, a vertical distance z2 between points 772, 773 is in a range of between 5% and 95% of the overall vertical span of metallization structure 730a—e.g., wherein the range is between 25% and 75% of said vertical span. In one such embodiment, the overall vertical span of metallization structure 730a is greater than or equal to a sum of the vertical distances z1, z2 shown.

FIG. 7A shows a horizontal distance x1 between point 772 and another point at side 770 (in this example, point 771) which is closer to surface 714, and which is outside of, or at an end of, the corrugation structure. FIG. 7A also shows a horizontal distance x2 between point 772 and another point at side 770 (in this example, point 773) which is farther from surface 714, and which is outside of, or at an end of, the corrugation structure. In the example embodiment shown, the horizontal span of the corrugation structure formed by side 770 is equal (or greater than) to the longer one of horizontal distances x1, x2.

In various embodiments, the horizontal span of side 770 at the corrugation structure is at least 5% of the vertical span of metallization structure 730a—e.g., wherein the horizontal span is at least 10% of the overall vertical span of metallization structure 730a. In some embodiments, the horizontal span of side 770 at the corrugation structure is in a range of between 5% and 40% of the overall vertical span of metallization structure 730a—e.g., wherein the range is between 10% and 30% of said vertical span.

Additionally or alternatively, that part of side 770 which forms a portion of the corrugation structure between points 772, 771 extends at an angle $\theta 1$ with a vertical plane which extends down from surface 714. In one such embodiment, the angle $\theta 1$ is in a range of between 20° and 80°—e.g., wherein the range is between 30° and 80° (and, in some embodiments, between 35° and 80°). Alternatively or in addition, that part of side 770 which forms another portion of the corrugation structure between points 772, 771 extends at an angle $\theta 2$ with a vertical plane which extends down from surface 714. In one such embodiment, the angle $\theta 2$ is in a range of between 20° and 80°—e.g., wherein the range is between 20° and 70° (and, in some embodiment, between 30° and 65°).

A vertical thickness z3 of socket body structure 720 is, for example, in a range of between 0.5 mm and 5 mm—e.g., wherein the range is between 0.8 mm and 3 mm (and, in some embodiments, between 1 mm and 2.6 mm). In some embodiments, a vertical thickness z4 of shield structure 740 (or of shield structure 741) is in a range of between 5% and 95% of the vertical thickness z3. For example, vertical thickness z4 is in a range between 40% and 90% of vertical thickness z3 (and, in some embodiments, between 60% and 85% of vertical thickness z3). In one such embodiment, a horizontal thickness x3 of shield structure 740 (or of shield structure 741) is in a range of between 0.01 mm and 0.2 mm—e.g., wherein the range is between 0.03 mm and 0.1 mm (and, in some embodiments, between 0.04 mm and 0.06 mm).

Figure 8A:
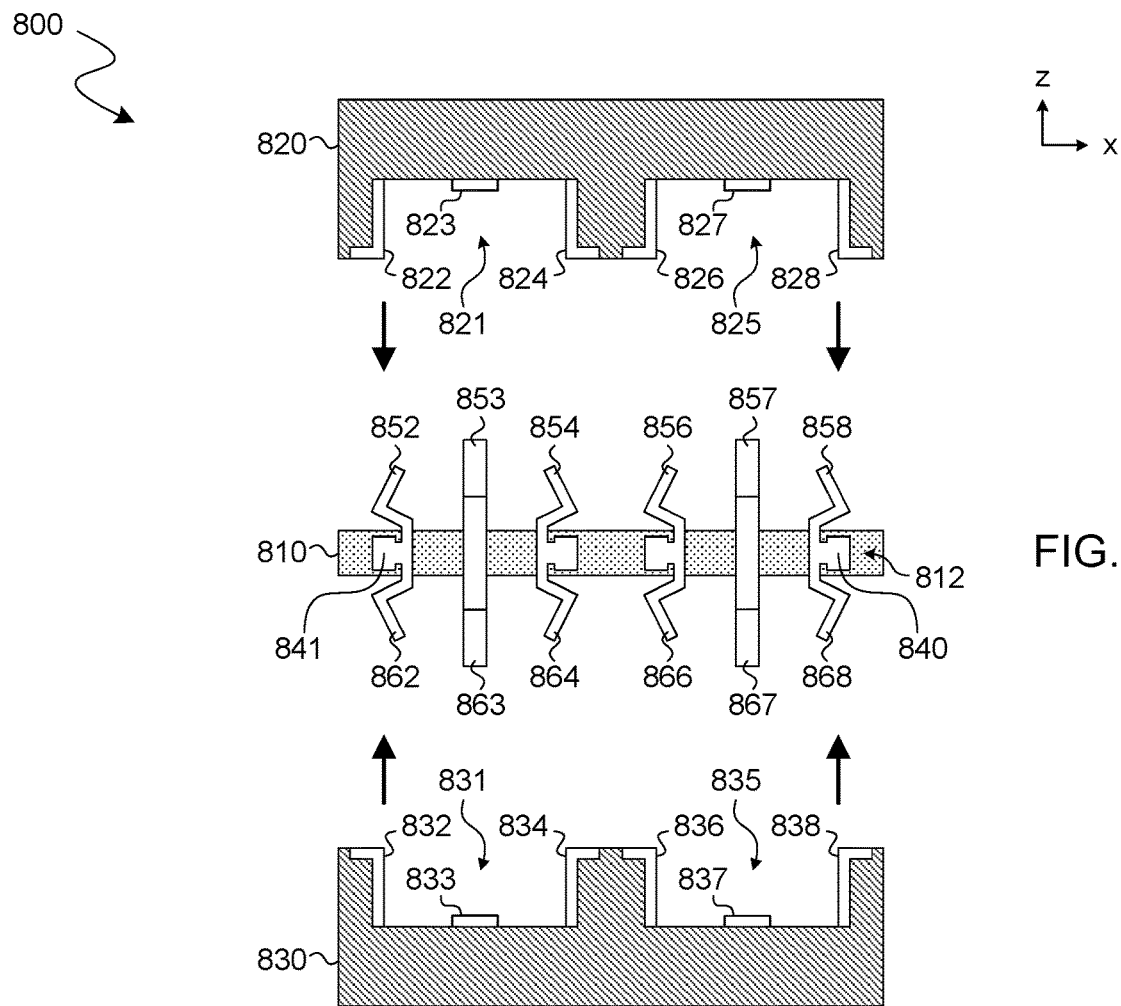
FIGS. 8A, 8B illustrate cross-sectional side view diagrams each showing respective features of an assembly of packages with a socket device according to an embodiment.
Figure 8B:
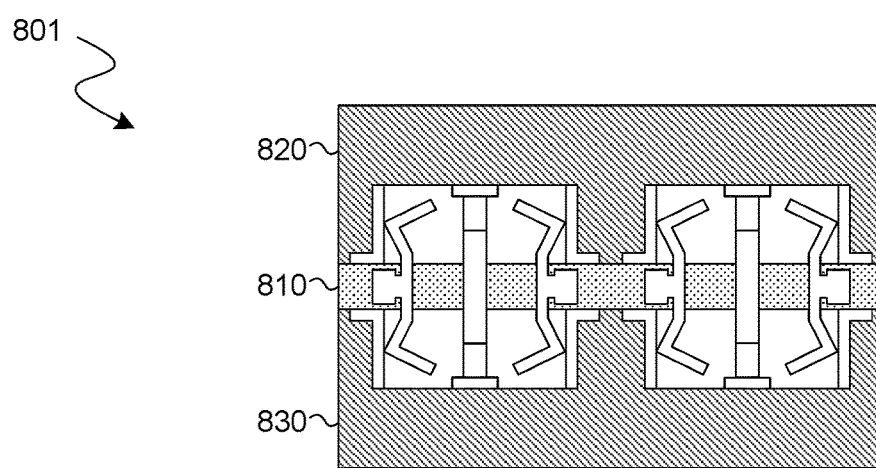

FIGS. 8A, 8B show stages 801, 802 of an assembly process to couple packaged devices each to a dual-sided socket according to another embodiment. Assembly such as that illustrated by stages 801, 802 is to provide structures such as those of system 100—e.g., where such assembly includes some or all of method 600.

As shown in FIG. 8A, packaged devices 820, 830 are variously brought into alignment with a dual-sided socket 810 at stage 800—e.g., where dual-sided socket 810, packaged device 820, and packaged device 830 correspond functionally to dual-sided socket 110, packaged device 140, and packaged device 150 (respectively). Dual-sided socket 810 comprises a socket body structure 812 and conductors which variously extend vertically therefrom.

A first hardware interface of dual-sided socket 810 comprises metallization structures 852-858 which variously extend vertically from a first side of socket body structure 812. Furthermore, a second hardware interface of dual-sided socket 810 comprises metallization structures 862-868 variously extending vertically from a second side of socket body structure 812 which is opposite the first side. The first hardware interface and the second hardware interface facilitate coupling of dual-sided socket 810 with packaged device 820, and packaged device 830 (respectively). Metallization structures 852-858 are electrically coupled, through socket body structure 812, to metallization structures 862-868 (respectively).

In one such embodiment, metallization structures 853, 863 are respective portions of a first conductor which is to communicate a first single-ended signal through socket body structure 812. Protection of an integrity of the first electrical signal is provided at least in part with a shield structure 841 which is electrically coupled to each of metallization structures 852, 854, 862, 864. For example, metallization structures 852, 854, 862, 864 are to variously provide a ground voltage (or other reference potential), wherein shield structure 841 extends substantially around the first conductor.

Alternatively or in addition, metallization structures 857, 867 are respective portions of a second conductor which is to communicate a second single-ended signal through socket body structure 812. Protection of an integrity of the second electrical signal is provided at least in part with another shield structure 840 which is electrically coupled to each of metallization structures 856, 858, 866, 868. For example, metallization structures 856, 858, 866, 868 are to variously provide a ground voltage or other reference potential, wherein shield structure 840 extends substantially around the second conductor. In one such embodiment, one or more of metallization structures 852, 854, 856, 858, 862, 864, 866, 868 each form a respective corrugation structure which, for example, has some or all of the features of the corrugation structure formed by metallization structure 730a.

A hardware interface of packaged device 820, comprising conductive contacts 822-824, and conductive contacts 826-828, facilitates coupling of packaged device 820 to the first hardware interface of dual-sided socket 810. Recess structures 821, 825 are variously formed at a side of packaged device 820, wherein conductive contacts 822, 823, 824 variously extend in recess structure 821, and conductive contacts 826, 827, 828 variously extend in recess structure 825. Conductive contacts 822-824, 826-828 are variously electrically coupled to respective integrated circuitry and/or other circuit resources (not shown) of packaged device 820.

Alternatively or in addition, a hardware interface of packaged device 830, comprising conductive contacts 832-834, and conductive contacts 836-838, facilitates coupling of packaged device 830 to the second hardware interface of dual-sided socket 810. Recess structures 831, 835 are variously formed at a side of packaged device 830, wherein conductive contacts 832, 833, 834 variously extend in recess structure 831, and conductive contacts 836, 837, 838 variously extend in recess structure 835. Conductive contacts 832-834, 836-838 are variously electrically coupled to respective integrated circuitry and/or other circuit resources (not shown) of packaged device 830.

At stage 800, metallization structures 852-854 are aligned with the respective conductive contacts 822-824, metallization structures 856-858 are aligned with the respective conductive contacts 826-828, metallization structures 862-864 are aligned with the respective conductive contacts 832-834, and metallization structures 866-868 are aligned with the respective conductive contacts 836-838

At stage 801, dual-sided socket 810 and packaged device 820 are moved relative to each other to bring metallization structures 852-854 into recess 821, and metallization structures 856-858 into recess 825. Metallization structures 852-854 are thus brought into physical contact with the respective conductive contacts 822-824, where metallization structures 856-858 come into physical contact with the respective conductive contacts 826-828. For a given one of metallization structures 852, 854, 856, 858, such relative motion of dual-sided socket 810 and packaged device 820 results in a corrugation, formed by that metallization structure, being deflected horizontally by a corresponding one of conductive contacts 822, 824, 826, 828. In one such embodiment, a securing mechanism such as an alignment pin (not shown) resists lateral movement of dual-sided socket 810 relative to packaged device 820, to maintain some or all of said horizontal deflection. This deflection maintains an application of force on the corresponding conductive contact, which (in combination with similar forces variously applied by other metallization structures) provides for increased coupling strength between dual-sided socket 810 and packaged device 820.

Similarly, at stage 801, dual-sided socket 810 and packaged device 830 are moved relative to each other to bring metallization structures 862-864 into recess 831, and metallization structures 866-868 into recess 835. Metallization structures 862-864 are thus brought into physical contact with the respective conductive contacts 832-834, where metallization structures 866-868 come into physical contact with the respective conductive contacts 836-838. For a given one of metallization structures 862, 864, 866, 868, such relative motion of dual-sided socket 810 and packaged device 830 results in a corrugation, formed by that metallization structure, being deflected horizontally by a corresponding one of conductive contacts 832, 834, 836, 838. In one such embodiment, a securing mechanism (not shown) resists lateral movement of dual-sided socket 810 relative to packaged device 830, to maintain some or all of said horizontal deflection. This deflection maintains an application of force on the corresponding conductive contact, which (in combination with similar forces variously applied by other metallization structures) provides for increased coupling strength between dual-sided socket 810 and packaged device 830.

Figure 9A:
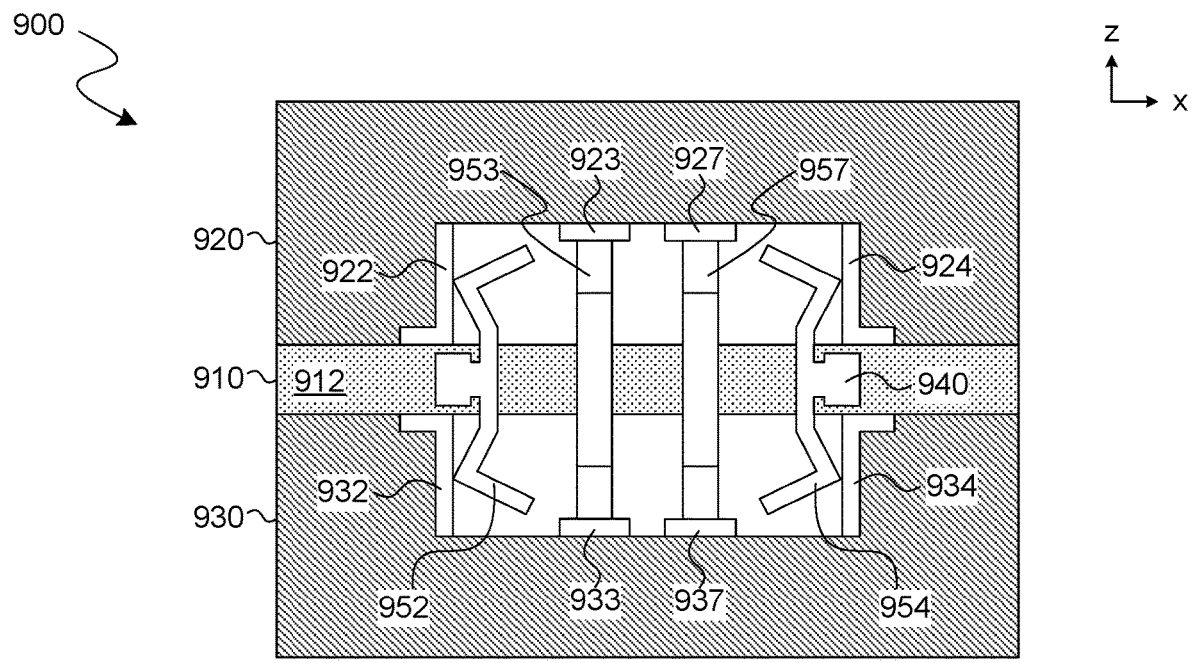
FIGS. 9A, 9B illustrate cross-sectional side view diagrams each showing respective features of a dual-sided socket which supports differential signal communication according to a corresponding embodiment.

FIG. 9A, shows features of a system 900 comprising socket structures to facilitate communication of a differential signal pair according to an embodiment. System 900 includes some or all of the features of system 100, in some embodiments—e.g., wherein functionality of system 900 is provide according to one of methods 200, 600.

As shown in FIG. 9A, system 900 comprises a dual-sided socket device 910 and packaged devices 920, 930 coupled thereto. Dual-sided socket device 910 comprises a socket body structure 912 and conductors which variously extend through packaged device 920. The conductors variously form metallization structures which each extend vertically from a respective side of packaged device 920.

A first hardware interface of dual-sided socket 910 (comprising a first plurality of said metallization structures) enables coupling with a hardware interface of packaged device 820 which, for example, includes conductive contacts 922, 923, 924, 927. A second hardware interface of dual-sided socket 910 (comprising a second plurality of said metallization structures) enables coupling with a hardware interface of packaged device 830 which, for example, includes conductive contacts 932, 933, 934, 937.

In the example embodiment shown, coupling of packaged device 920 to packaged device 930 via dual-sided socket 910 comprises bringing corrugation structures of a conductor 952 each into contact with a respective one of conductive contacts 922, 932, and bringing corrugation structures of another conductor 954 each into contact with a respective one of conductive contacts 924, 934. Such coupling further comprises bringing respective metallization structures of a conductor 953 each into contact with a respective one of conductive contacts 923, 933, and bringing respective metallization structures of another conductor 957 each into contact with a respective one of conductive contacts 927, 937.

In one such embodiment, conductors 953, 957 are each to communicate a different respective signal of a differential signal pair. Protection of an integrity of such communication is provided at least in part with a shield structure 940 which is electrically coupled to each of conductors 952, 954. For example, conductors 952, 954 are to variously provide a ground voltage, or other reference potential, wherein shield structure 940 extends substantially around conductors 953, 957.

Figure 9B:
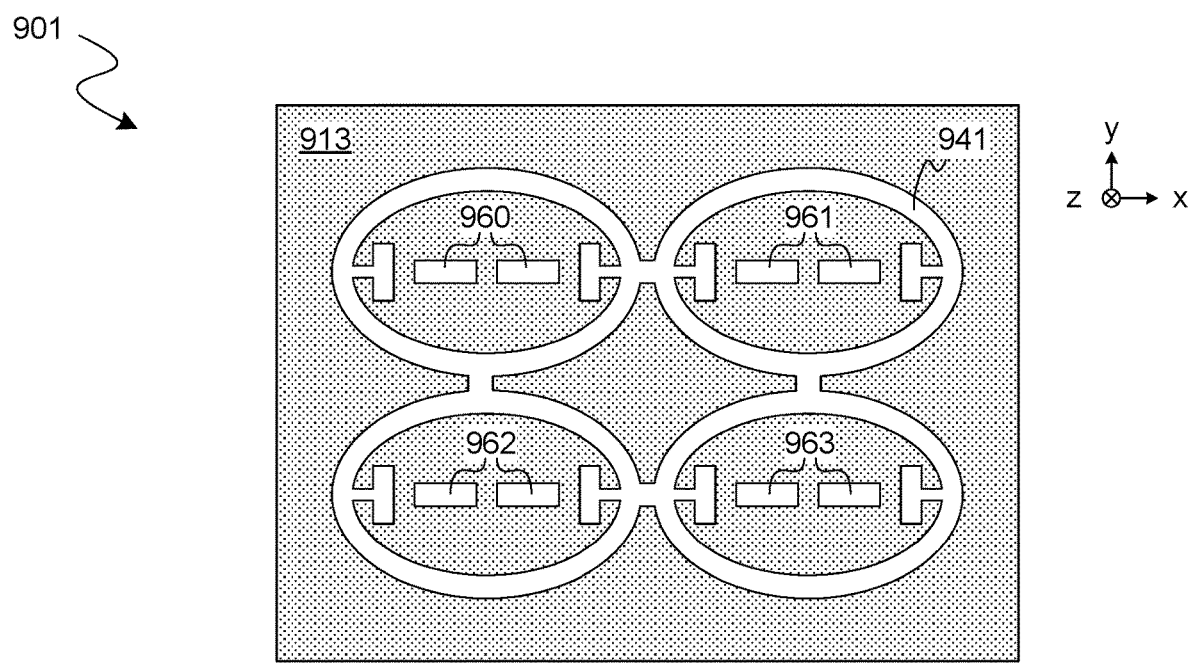

FIG. 9B shows a cross-sectional top view of dual-sided socket 901 which, for example, includes some or all of the features of dual-sided socket 900. As shown in FIG. 9B, dual-sided socket 901 comprises a socket body structure 912 and pairs of conductors (e.g., including conductor pairs 960-963 shown) which extending through socket body structure 912, the pairs of conductors each to communicate a different respective differential signal pair.

A shield structure 941 is formed by electrically coupled portions which each extends substantially around a respective one of conductor pairs 960-963. Shield structure 941 is further electrically coupled to metallization structures (e.g., including those of conductors 952, 954) which form respective corrugation structures such as any of those variously described herein. In providing such coupling between shield structure 941 and said metallization structures, some embodiments variously promote the integrity of signal communication via a socket device which requires a low insertion force for coupling, and which is easily decoupled completely from a packaged device.

Figure 10:
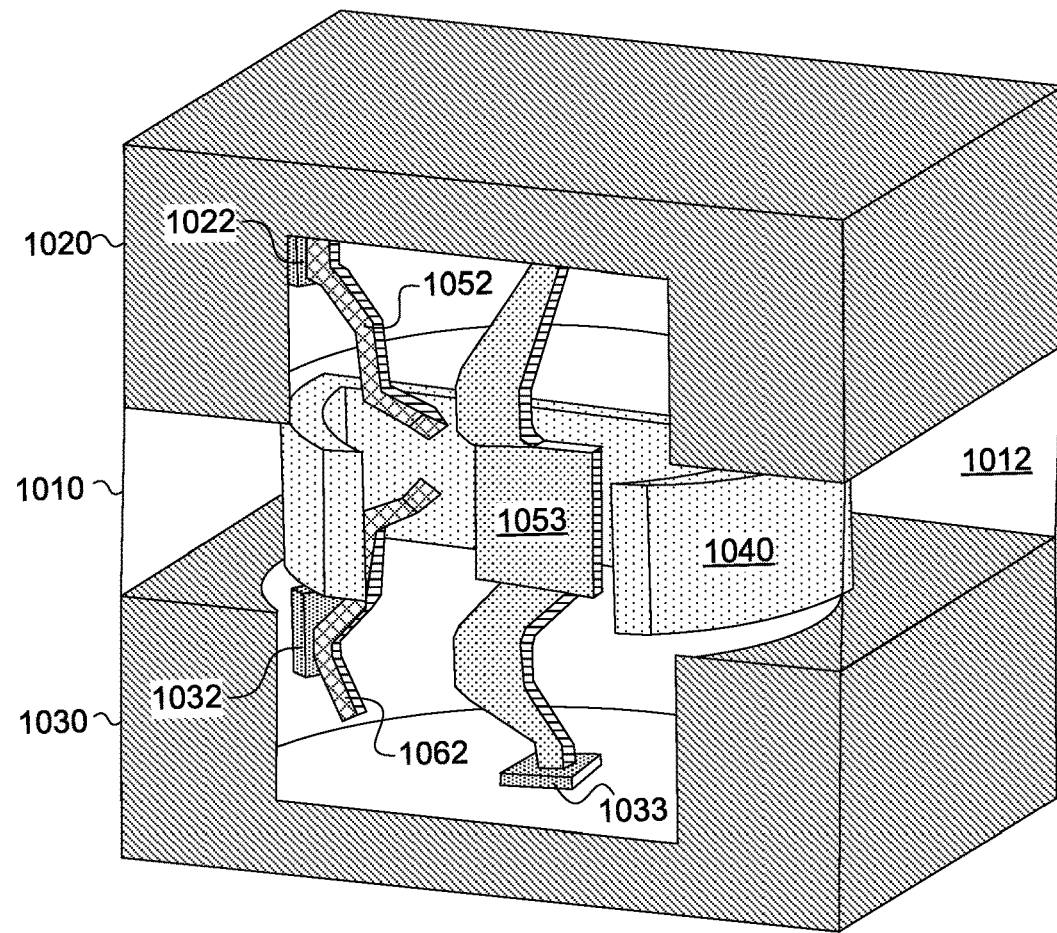
FIG. 10 illustrates a cross-sectional perspective view diagram showing features of a dual-sided socket device according to an embodiment.

FIG. 10 shows features of a system 1000 to protect an integrity of a signal communication in a socket device according to an embodiment. In various embodiments, system 1000 includes features of system 100—e.g., where functionality of system 1000 is provided according to one of methods 200, 600.

As shown in FIG. 10, system 1000 includes a dual-sided socket 1010, a packaged device 1020, and a packaged device 1030 which—for example—correspond functionally to dual-sided socket 810, packaged device 820, and packaged device 830 (respectively). Dual-sided socket 1010 comprises a socket body structure 1012, and a conductor 1053 which extends through socket body structure 1012 to provide metallization structures on opposite respective sides thereof. Other metallization structures 1052, 1062 of dual-sided socket 1010—which variously extend from the opposite sides of socket body structure 1012—provide respective corrugation structures to promote a strength of coupling with packaged devices 1020, 1030.

Packaged device 1030 comprises conductive contacts 1032, 1033 which facilitate electrical coupling with metallization structure 1062 and conductor 1053 (respectively)—e.g., wherein a conductive contact 1022 of packaged device 1020 facilitates electrical coupling with metallization structure 1052.

Dual-sided socket 1010 further comprises a shield structure 1040 comprising a conductor which, in socket body structure 1012, extends substantially around conductor 1053. Shield structure 1040 is electrically coupled to metallization structures 1052, 1062 to promote shielding of signal communications with conductor 1053. In one such embodiment, packaged devices 1020, 1030 are to communicate a single-ended signal via conductor 1053—e.g., wherein an integrity of the signal is protected at least in part with a reference potential (e.g., a ground voltage) that is provided to shield structure 1040 via one of metallization structures 1052, 1062.

In one such embodiment, socket body structure 1012, shield structure 1040, and metallization structures 1052, 1062 correspond functionally to socket body structure 812, shield structure 840, and metallization structures 856, 866 (respectively)—e.g., wherein conductor 1053 forms metallization structures 857, 867. For example, conductive contacts 1032, 1033 correspond functionally to conductive contacts 836, 837 (respectively) in said embodiment—e.g., wherein conductive contact 1022 corresponds functionally to conductive contact 826.

Figure 11:
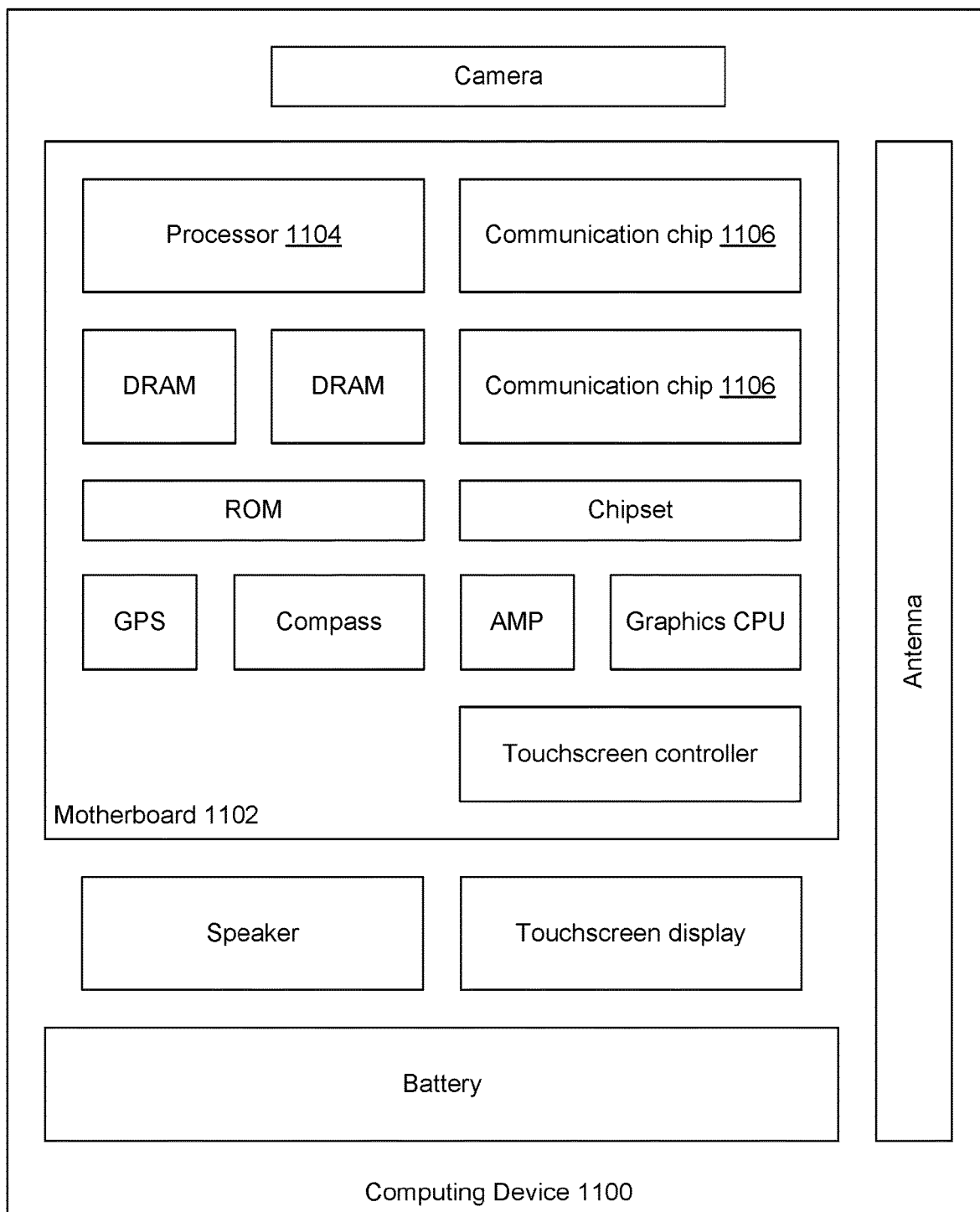
FIG. 11 is a functional block diagram illustrating a computing device in accordance with one embodiment.

FIG. 11 illustrates a computing device 1100 in accordance with one embodiment. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. The term "processor" may refer to any device or portion of a device that processes electronic data from registers and/or memory to transform that electronic data into other electronic data that may be stored in registers and/or memory. The communication chip 1106 also includes an integrated circuit die packaged within the communication chip 1106.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 12:
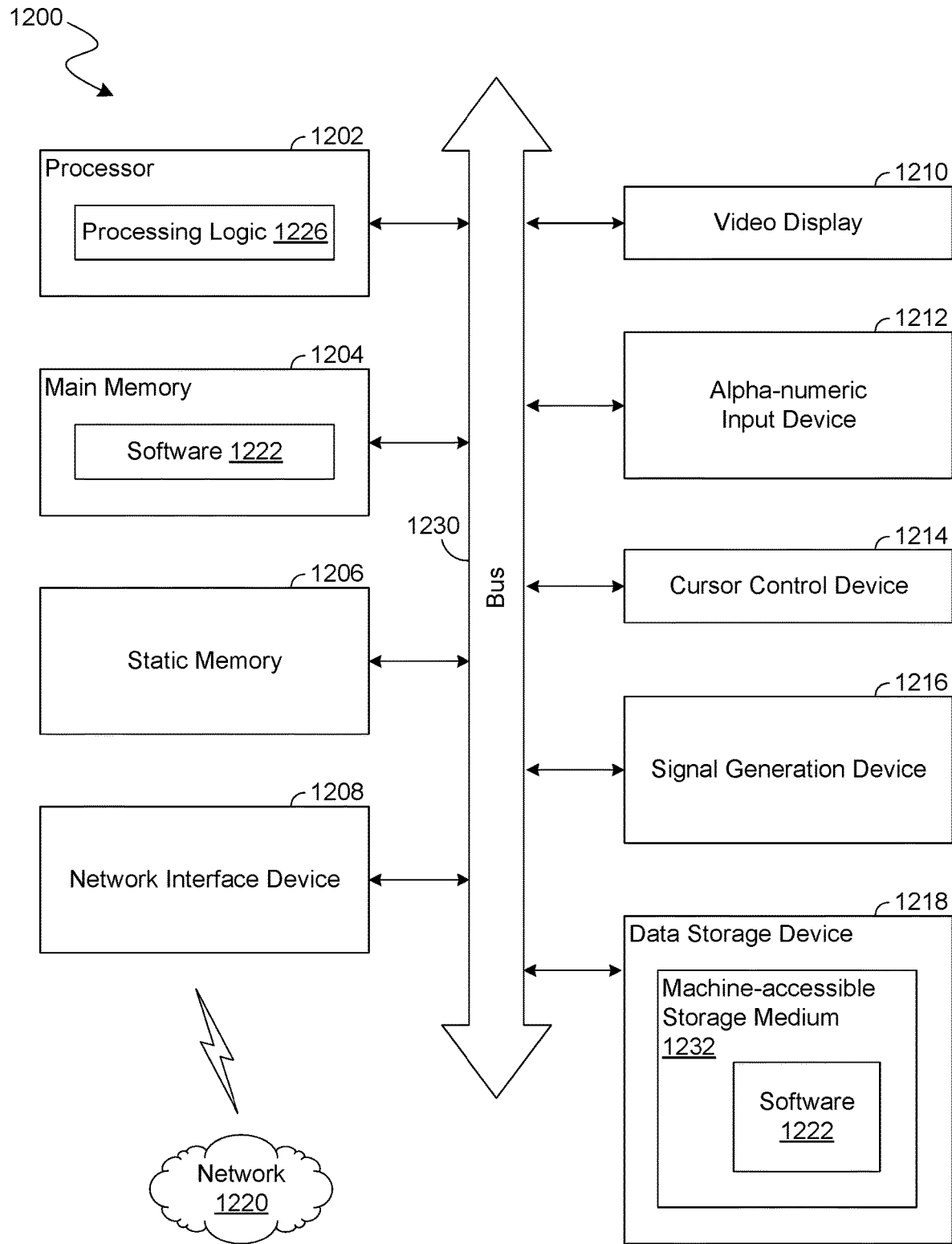
FIG. 12 is a functional block diagram illustrating an exemplary computer system, in accordance with one embodiment.

FIG. 12 illustrates a diagrammatic representation of a machine in the exemplary form of a computer system 1200 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1200 includes a processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1202 may also be one or more special-purpose processing devices such as an application specific integrated circuit (ASIC), a field programmable gate array (FPGA), a digital signal processor (DSP), network processor, or the like. Processor 1202 is configured to execute the processing logic 1226 for performing the operations described herein.

The computer system 1200 may further include a network interface device 1208. The computer system 1200 also may include a video display unit 1210 (e.g., a liquid crystal display (LCD), a light emitting diode display (LED), or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium (or more specifically a computer-readable storage medium) 1232 on which is stored one or more sets of instructions (e.g., software 1222) embodying any one or more of the methodologies or functions described herein. The software 1222 may also reside, completely or at least partially, within the main memory 1204 and/or within the processor 1202 during execution thereof by the computer system 1200, the main memory 1204 and the processor 1202 also constituting machine-readable storage media. The software 1222 may further be transmitted or received over a network 1220 via the network interface device 1208.

While the machine-accessible storage medium 1232 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Example 1: A socket device comprising: a socket body structure comprising a first side, and a second side opposite the first side; a first plurality of metallization structures which each extend vertically from the first side, wherein a pitch of the first plurality of metallization structures is in a range of between 0.1 millimeters (mm) and 2 mm; and a second plurality of metallization structures which each extend vertically from the second side, the second plurality of metallization structures each electrically coupled to a respective one of the first plurality of metallization structures; wherein, for each of the first plurality of metallization structures, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

Example 2: The socket device of Example 1, wherein, for each of the first plurality of metallization structures, the portion of the side of the metallization structure forms an angle with a vertical plane, wherein the angle is in a range of between 20° and 80°.

Example 3: The socket device of Example 1, wherein, for each of the first plurality of metallization structures, the horizontal span of the portion of the side of the metallization structure is at least 10% of the vertical span of the metallization structure.

Example 4: The socket device of Example 1, wherein, for each of the second plurality of metallization structures: a vertical span of the metallization structure is in a range of between 0.05 mm and 2.0 mm; a portion of a side of the metallization structure forms a respective corrugation structure; and a horizontal span of the portion is at least 5% of the vertical span of the metallization structure.

Example 5: The socket device of Example 1, wherein the socket body structure forms first recess structures at the first side, wherein the first plurality of metallization structures each extend in a respective one of the first recess structures.

Example 6: The socket device of Example 5, wherein the socket body structure forms second recess structures at the second side, wherein the second plurality of metallization structures each extend in a respective one of the second recess structures.

Example 7: The socket device of Example 1, wherein, for each of the first plurality of metallization structures: the side of the metallization structure includes a first point, a second point, and a third point; the second point is between the first point and the third point; the second point is a point of the respective corrugation structure which is most offset horizontally from a line which extends between the first point and the third point; and a vertical distance between the second point and a distal end of the metallization structure is at least 5% of the vertical span of the metallization structure.

Example 8: A method comprising: coupling first conductive contacts of a first packaged device each to a respective one of a first plurality of metallization structures which each extend vertically from a first side of a socket body structure of a socket device, wherein a pitch of the first plurality of metallization structures is in a range of between 0.1 millimeters (mm) and 2 mm; and coupling second conductive contacts of a second packaged device each to a respective one of a second plurality of metallization structures each extending vertically from a second side of the socket body structure, the second plurality of metallization structures each electrically coupled to a respective one of the first plurality of metallization structures; wherein, for each of the first plurality of metallization structures, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

Example 9: The method of Example 8, further comprising: communicating signals, each via a respective one of the first plurality of metallization structures and a respective one of the second plurality of metallization structures, between the first packaged device and the second packaged device.

Example 10: The method of Example 8, wherein, for each of the first plurality of metallization structures, the portion of the side of the metallization structure forms an angle with a vertical plane, wherein the angle is in a range of between 20° and 80°.

Example 11: The method of Example 8, wherein, for each of the first plurality of metallization structures, the horizontal span of the portion of the side of the metallization structure is at least 10% of the vertical span of the metallization structure.

Example 12: The method of Example 8, wherein, for each of the second plurality of metallization structures: a vertical span of the metallization structure is in a range of between 0.05 mm and 2.0 mm; a portion of a side of the metallization structure forms a respective corrugation structure; and a horizontal span of the portion is at least 5% of the vertical span of the metallization structure.

Example 13: The method of Example 8, wherein the socket body structure forms first recess structures at the first side, wherein the first plurality of metallization structures each extend in a respective one of the first recess structures.

Example 14: The method of Example 13, wherein the socket body structure forms second recess structures at the second side, wherein the second plurality of metallization structures each extend in a respective one of the second recess structures.

Example 15: The method of Example 8, wherein, for each of the first plurality of metallization structures: the side of the metallization structure includes a first point, a second point, and a third point; the second point is between the first point and the third point; the second point is a point of the respective corrugation structure which is most offset horizontally from a line which extends between the first point and the third point; and a vertical distance between the second point and a distal end of the metallization structure is at least 5% of the vertical span of the metallization structure.

Example 16: A system comprising: a first packaged device; a second packaged device; and a socket device comprising: a socket body structure comprising a first side, and a second side opposite the first side, wherein the first packaged device and the second packaged device are coupled to the socket device via the first side and the second side, respectively; a first plurality of metallization structures which each extend vertically from the first side, wherein a pitch of the first plurality of metallization structures is in a range of between 0.1 millimeters (mm) and 2 mm; and a second plurality of metallization structures which each extend vertically from the second side, the second plurality of metallization structures each electrically coupled to a respective one of the first plurality of metallization structures; wherein, for each of the first plurality of metallization structures, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

Example 17: The system of Example 16, wherein, for each of the first plurality of metallization structures, the portion of the side of the metallization structure forms an angle with a vertical plane, wherein the angle is in a range of between 20° and 80°.

Example 18: The system of Example 16, wherein, for each of the first plurality of metallization structures, the horizontal span of the portion of the side of the metallization structure is at least 10% of the vertical span of the metallization structure.

Example 19: The system of Example 16, wherein, for each of the second plurality of metallization structures: a vertical span of the metallization structure is in a range of between 0.05 mm and 2.0 mm; a portion of a side of the metallization structure forms a respective corrugation structure; and a horizontal span of the portion is at least 5% of the vertical span of the metallization structure.

Example 20: The system of Example 16, wherein the socket body structure forms first recess structures at the first side, wherein the first plurality of metallization structures each extend in a respective one of the first recess structures.

Example 21: The system of Example 20, wherein the socket body structure forms second recess structures at the second side, wherein the second plurality of metallization structures each extend in a respective one of the second recess structures.

Example 22: The system of Example 16, wherein, for each of the first plurality of metallization structures: the side of the metallization structure includes a first point, a second point, and a third point; the second point is between the first point and the third point; the second point is a point of the respective corrugation structure which is most offset horizontally from a line which extends between the first point and the third point; and a vertical distance between the second point and a distal end of the metallization structure is at least 5% of the vertical span of the metallization structure.

Example 23: A socket device comprising: a socket body structure comprising a first side, and a second side opposite the first side; conductors which each extend through the socket body structure and further extend vertically from each of the first side and the second side, wherein a pitch of the conductors at the first side is in a range of between 0.1 millimeters (mm) and 3 mm; a first metallization structure which extends from the first side; a second metallization structure which extends from the second side; and a conductive shield structure, between the first side and the second side, which is electrically coupled to each of the first metallization structure and the second metallization structure, wherein the conductive shield structure substantially extends around one of the conductors; wherein, for each of the first metallization structure and the second metallization structure, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

Example 24: The socket device of Example 23, wherein the socket device comprises: a first interface comprising: respective first portions of the conductors, wherein the respective first portions extend from the first side; and a first plurality of metallization structures which extend from the first side, the first plurality of metallization structures comprising the first metallization structure; a second interface comprising: respective second portions of the conductors, wherein the respective second portions extend from the second side; and a second plurality of metallization structures which extend from the second side, the second plurality of metallization structures comprising the second metallization structure; multiple conductive shield structures each between the first side and the second side, and each electrically coupled both to a respective one of the first plurality of metallization structures and to a respective one of the second plurality of metallization structures, wherein the multiple conductive shield structures each substantially extend around a respective one of the conductors.

Example 25: The socket device of Example 24, wherein, for each metallization structure of the first plurality of metallization structures and the second plurality of metallization structures, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

Example 26: The socket device of Example 25, wherein, for each of the conductors: a respective two of the first plurality of metallization structures are on opposite respective sides of the respective first portion of the conductor; a respective two of the second plurality of metallization structures are on opposite respective sides of the respective second portion of the conductor; and a respective one of the multiple conductive shield structures is electrically coupled to each of the respective two of the first plurality of metallization structures, and the respective two of the second plurality of metallization structures.

Example 27: The socket device of Example 24, wherein the multiple conductive shield structures are electrically coupled to each other.

Example 28: The socket device of Example 23, wherein the conductive shield structure substantially extends around two of the conductors.

Example 29: The socket device of Example 23, wherein, for each of the first metallization structure and the second metallization structure, the portion of the side of the metallization structure forms an angle with a vertical plane, wherein the angle is in a range of between 20° and 80°.

Example 30: A method comprising: coupling first conductive contacts of a first packaged device to a first interface of a socket device, the first interface comprising a first metallization structure extending vertically from a first side of a socket body structure, and respective first portions of conductors, wherein a pitch of the conductors at the first side is in a range of between 0.1 millimeters (mm) and 3 mm; and coupling second conductive contacts of a second packaged device each to a second interface of the socket device, the second interface comprising respective second portions of the conductors, and a second metallization structure which extends vertically from a second side of the socket body structure; wherein, for each of the first metallization structure and the second metallization structure, a vertical span of the metallization structure is in a range between 0.05 mm and 2.0 mm, a portion of a side of the metallization structure forms a respective corrugation structure, and a horizontal span of the portion is at least 5% of the vertical span of the metallization structure; and wherein a conductive shield structure of the socket device is electrically coupled to each of the first metallization structure and the second metallization structure, wherein the conductive shield structure substantially extends around one of the conductors.

Example 31: The method of Example 30, further comprising: providing a reference potential to one of the first metallization structure or the second metallization structure; and while the reference potential is provided to the one of the first metallization structure or the second metallization structure, communicating a signal, via the one of the conductors, between the first packaged device and the second packaged device.

Example 32: The method of Example 30, wherein: the first interface comprises a first plurality of metallization structures which extend from the first side, the first plurality of metallization structures comprising the first metallization structure; the second interface comprises a second plurality of metallization structures which extend from the second side, the second plurality of metallization structures comprising the second metallization structure; and multiple conductive shield structures of the socket device are each between the first side and the second side, and are each electrically coupled both to a respective one of the first plurality of metallization structures and to a respective one of the second plurality of metallization structures, wherein the multiple conductive shield structures each substantially extend around a respective one of the conductors.

Example 33: The method of Example 32, wherein, for each metallization structure of the first plurality of metallization structures and the second plurality of metallization structures, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

Example 34: The method of Example 33, wherein, for each of the conductors: a respective two of the first plurality of metallization structures are on opposite respective sides of the respective first portion of the conductor; a respective two of the second plurality of metallization structures are on opposite respective sides of the respective second portion of the conductor; and a respective one of the multiple conductive shield structures is electrically coupled to each of the respective two of the first plurality of metallization structures, and the respective two of the second plurality of metallization structures.

Example 35: The method of Example 32, wherein the multiple conductive shield structures are electrically coupled to each other.

Example 36: The method of Example 30, wherein the conductive shield structure substantially extends around two of the conductors.

Example 37: The method of Example 30, wherein, for each of the first metallization structure and the second metallization structure, the portion of the side of the metallization structure forms an angle with a vertical plane, wherein the angle is in a range of between 20° and 80°.

Example 38: A system comprising: a first packaged device; a second packaged device; and a socket device comprising: a socket body structure comprising a first side, and a second side opposite the first side, wherein the first packaged device and the second packaged device are coupled to the socket device via the first side and the second side, respectively; conductors which each extend through the socket body structure and further extend vertically from each of the first side and the second side, wherein a pitch of the conductors at the first side is in a range of between 0.1 millimeters (mm) and 3 mm; a first metallization structure which extends from the first side; a second metallization structure which extends from the second side; and a conductive shield structure, between the first side and the second side, which is electrically coupled to each of the first metallization structure and the second metallization structure, wherein the conductive shield structure substantially extends around one of the conductors; wherein, for each of the first metallization structure and the second metallization structure, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

Example 39: The system of Example 38, wherein the socket device comprises: a first interface comprising: respective first portions of the conductors, wherein the respective first portions extend from the first side; and a first plurality of metallization structures which extend from the first side, the first plurality of metallization structures comprising the first metallization structure; a second interface comprising: respective second portions of the conductors, wherein the respective second portions extend from the second side; and a second plurality of metallization structures which extend from the second side, the second plurality of metallization structures comprising the second metallization structure; and multiple conductive shield structures each between the first side and the second side, and each electrically coupled both to a respective one of the first plurality of metallization structures and to a respective one of the second plurality of metallization structures, wherein the multiple conductive shield structures each substantially extend around a respective one of the conductors.

Example 40: The system of Example 39, wherein, for each metallization structure of the first plurality of metallization structures and the second plurality of metallization structures, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

Example 41: The system of Example 40, wherein, for each of the conductors: a respective two of the first plurality of metallization structures are on opposite respective sides of the respective first portion of the conductor; a respective two of the second plurality of metallization structures are on opposite respective sides of the respective second portion of the conductor; and a respective one of the multiple conductive shield structures is electrically coupled to each of the respective two of the first plurality of metallization structures, and the respective two of the second plurality of metallization structures.

Example 42: The system of Example 40, wherein the multiple conductive shield structures are electrically coupled to each other.

Example 43: The system of Example 38, wherein the conductive shield structure substantially extends around two of the conductors.

Example 44: The system of Example 38, wherein, for each of the first metallization structure and the second metallization structure, the portion of the side of the metallization structure forms an angle with a vertical plane, wherein the angle is in a range of between 20° and 80°.

Techniques and architectures for coupling IC packages with a dual-sided socket device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A socket device comprising:
    a socket body structure comprising a first side, and a second side opposite the first side;
    conductors which each extend through the socket body structure and further extend vertically from each of the first side and the second side, wherein a pitch of the conductors at the first side is in a range of between 0.1 millimeters (mm) and 3 mm;
    a first metallization structure which extends from the first side;
    a second metallization structure which extends from the second side; and
    a conductive shield structure, between the first side and the second side, which is electrically coupled to each of the first metallization structure and the second metallization structure, wherein the conductive shield structure substantially extends around one of the conductors;
    wherein, for each of the first metallization structure and the second metallization structure, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

2. The socket device of claim 1, wherein the socket device comprises:
    a first interface comprising:
        respective first portions of the conductors, wherein the respective first portions extend from the first side; and
        a first plurality of metallization structures which extend from the first side, the first plurality of metallization structures comprising the first metallization structure;
    a second interface comprising:
        respective second portions of the conductors, wherein the respective second portions extend from the second side; and
        a second plurality of metallization structures which extend from the second side, the second plurality of metallization structures comprising the second metallization structure; and
    multiple conductive shield structures each between the first side and the second side, and each electrically coupled both to a respective one of the first plurality of metallization structures and to a respective one of the second plurality of metallization structures, wherein the multiple conductive shield structures each substantially extend around a respective one of the conductors.

3. The socket device of claim 2, wherein, for each metallization structure of the first plurality of metallization structures and the second plurality of metallization structures, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

4. The socket device of claim 3, wherein, for each of the conductors:
    a respective two of the first plurality of metallization structures are on opposite respective sides of the respective first portion of the conductor;
    a respective two of the second plurality of metallization structures are on opposite respective sides of the respective second portion of the conductor; and
    a respective one of the multiple conductive shield structures is electrically coupled to each of the respective two of the first plurality of metallization structures, and the respective two of the second plurality of metallization structures.

5. The socket device of claim 2, wherein the multiple conductive shield structures are electrically coupled to each other.

6. The socket device of claim 1, wherein the conductive shield structure substantially extends around two of the conductors.

7. The socket device of claim 1, wherein, for each of the first metallization structure and the second metallization structure, the portion of the side of the metallization structure forms an angle with a vertical plane, wherein the angle is in a range of between 20° and 80°.

8. A method comprising:
    coupling first conductive contacts of a first packaged device to a first interface of a socket device, the first interface comprising a first metallization structure extending vertically from a first side of a socket body structure, and respective first portions of conductors, wherein a pitch of the conductors at the first side is in a range of between 0.1 millimeters (mm) and 3 mm; and
    coupling second conductive contacts of a second packaged device each to a second interface of the socket device, the second interface comprising respective second portions of the conductors, and a second metallization structure which extends vertically from a second side of the socket body structure;
    wherein, for each of the first metallization structure and the second metallization structure, a vertical span of the metallization structure is in a range between 0.05 mm and 2.0 mm, a portion of a side of the metallization structure forms a respective corrugation structure, and a horizontal span of the portion is at least 5% of the vertical span of the metallization structure; and wherein a conductive shield structure of the socket device is electrically coupled to each of the first metallization structure and the second metallization structure, wherein the conductive shield structure substantially extends around one of the conductors.

9. The method of claim 8, further comprising:
providing a reference potential to one of the first metallization structure or the second metallization structure; and
while the reference potential is provided to the one of the first metallization structure or the second metallization structure, communicating a signal, via the one of the conductors, between the first packaged device and the second packaged device.

10. The method of claim 8, wherein:
the first interface comprises a first plurality of metallization structures which extend from the first side, the first plurality of metallization structures comprising the first metallization structure;
the second interface comprises a second plurality of metallization structures which extend from the second side, the second plurality of metallization structures comprising the second metallization structure; and
multiple conductive shield structures of the socket device are each between the first side and the second side, and are each electrically coupled both to a respective one of the first plurality of metallization structures and to a respective one of the second plurality of metallization structures, wherein the multiple conductive shield structures each substantially extend around a respective one of the conductors.

11. The method of claim 10, wherein, for each metallization structure of the first plurality of metallization structures and the second plurality of metallization structures, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

12. The method of claim 11, wherein, for each of the conductors:
a respective two of the first plurality of metallization structures are on opposite respective sides of the respective first portion of the conductor;
a respective two of the second plurality of metallization structures are on opposite respective sides of the respective second portion of the conductor; and
a respective one of the multiple conductive shield structures is electrically coupled to each of the respective two of the first plurality of metallization structures, and the respective two of the second plurality of metallization structures.

13. The method of claim 10, wherein the multiple conductive shield structures are electrically coupled to each other.

14. The method of claim 8, wherein the conductive shield structure substantially extends around two of the conductors.

15. The method of claim 8, wherein, for each of the first metallization structure and the second metallization structure, the portion of the side of the metallization structure forms an angle with a vertical plane, wherein the angle is in a range of between 20° and 80°.

16. A system comprising:
a first packaged device;
a second packaged device; and
a socket device comprising:
a socket body structure comprising a first side, and a second side opposite the first side, wherein the first packaged device and the second packaged device are coupled to the socket device via the first side and the second side, respectively;
conductors which each extend through the socket body structure and further extend vertically from each of the first side and the second side, wherein a pitch of the conductors at the first side is in a range of between 0.1 millimeters (mm) and 3 mm;
a first metallization structure which extends from the first side;
a second metallization structure which extends from the second side; and
a conductive shield structure, between the first side and the second side, which is electrically coupled to each of the first metallization structure and the second metallization structure, wherein the conductive shield structure substantially extends around one of the conductors;
wherein, for each of the first metallization structure and the second metallization structure, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

17. The system of claim 16, wherein the socket device comprises:
a first interface comprising:
respective first portions of the conductors, wherein the respective first portions extend from the first side; and
a first plurality of metallization structures which extend from the first side, the first plurality of metallization structures comprising the first metallization structure;
a second interface comprising:
respective second portions of the conductors, wherein the respective second portions extend from the second side; and
a second plurality of metallization structures which extend from the second side, the second plurality of metallization structures comprising the second metallization structure; and
multiple conductive shield structures each between the first side and the second side, and each electrically coupled both to a respective one of the first plurality of metallization structures and to a respective one of the second plurality of metallization structures, wherein the multiple conductive shield structures each substantially extend around a respective one of the conductors.

18. The system of claim 17, wherein, for each metallization structure of the first plurality of metallization structures and the second plurality of metallization structures, a vertical span of the metallization structure is in a range of between 0.05 mm and 2.0 mm, a portion of a side of the metallization structure forms a respective corrugation structure, and a horizontal span of the portion is at least 5% of the vertical span of the metallization structure.

19. The system of claim 18, wherein, for each of the conductors:
a respective two of the first plurality of metallization structures are on opposite respective sides of the respective first portion of the conductor;

a respective two of the second plurality of metallization structures are on opposite respective sides of the respective second portion of the conductor; and a respective one of the multiple conductive shield structures is electrically coupled to each of the respective two of the first plurality of metallization structures, and the respective two of the second plurality of metallization structures.

20. The system of claim 17, wherein the multiple conductive shield structures are electrically coupled to each other.

* * * * *